: US012400717B2

(12) United States Patent
Guo

(10) Patent No.: US 12,400,717 B2
(45) Date of Patent: Aug. 26, 2025

(54) ANALOG PEAK POWER MANAGEMENT FOR MULTI-DIE OPERATIONS

(71) Applicant: Yangtze Memory Technologies Co., Ltd., Hubei (CN)

(72) Inventor: Jason Guo, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 483 days.

(21) Appl. No.: 17/852,649

(22) Filed: Jun. 29, 2022

(65) Prior Publication Data

US 2022/0328108 A1    Oct. 13, 2022

Related U.S. Application Data

(63) Continuation-in-part of application No. 17/116,253, filed on Dec. 9, 2020, now Pat. No. 11,398,283.
(Continued)

(51) Int. Cl.
*G11C 16/30* (2006.01)
*G11C 5/06* (2006.01)
(Continued)

(52) U.S. Cl.
CPC ............... *G11C 16/30* (2013.01); *G11C 5/06* (2013.01); *G11C 5/147* (2013.01); *G11C 16/0483* (2013.01); *G11C 16/32* (2013.01)

(58) Field of Classification Search
CPC ........... G11C 16/30; G11C 5/06; G11C 5/147; G11C 16/0483; G11C 16/32; G11C 5/063; G11C 5/14
See application file for complete search history.

(56) References Cited

U.S. PATENT DOCUMENTS 6,175,598 B1    1/2001   Yu et al.
8,508,251 B2    8/2013   Choi et al.
(Continued)

FOREIGN PATENT DOCUMENTS

CN       102097124 A       6/2011

OTHER PUBLICATIONS

International Search Report of the International Searching Authority directed to related International Patent Application No. PCT/CN2020/128024, mailed Jul. 26, 2021; 4 pages.

*Primary Examiner* — Jay W. Radke
(74) *Attorney, Agent, or Firm* — Conley Rose, P.C.

(57) ABSTRACT

Methods of peak power management (PPM) for a storage system having multiple memory dies are disclosed. Each memory die includes a first PPM circuit and a second PPM circuit. First PPM circuits of the multiple memory dies are electrically connected to form a first PPM group. Similarly, second PPM circuits are electrically connected to form a second PPM group. Peak power operations can be managed by switching on a first pull-down driver of the first PPM circuit on a selected memory die when a first PPM enablement signal of the first PPM group is zero; waiting for a first delay period; switching on a second pull-down driver of the second PPM circuit on the selected memory die when a second PPM enablement signal of the second PPM group is zero. The PPM enablement signals depend on the current flowing through each pull-down driver in the first and second PPM groups.

41 Claims, 17 Drawing Sheets

Related U.S. Application Data which is a continuation of application No. PCT/CN2020/128024, filed on Nov. 11, 2020.

(51) Int. Cl.
*G11C 5/14* (2006.01)
*G11C 16/04* (2006.01)
*G11C 16/32* (2006.01)

(56) References Cited

U.S. PATENT DOCUMENTS

| | | | |
|---|---|---|---|
| 8,929,169 B1 | 1/2015 | Yang et al. | |
| 11,398,283 B2 * | 7/2022 | Guo | G11C 16/32 |
| 11,467,741 B2 * | 10/2022 | Guo | G11C 16/30 |
| 11,676,670 B2 * | 6/2023 | Guo | G11C 16/30 |
| | | | 365/226 |
| 2006/0284997 A1 * | 12/2006 | Lee | G11C 7/1069 |
| | | | 348/294 |
| 2014/0029357 A1 | 1/2014 | Lee et al. | |
| 2014/0286110 A1 | 9/2014 | Shimizu et al. | |
| 2016/0342187 A1 | 11/2016 | Ha et al. | |
| 2017/0054437 A1 * | 2/2017 | Donath | H03K 17/04106 |
| 2017/0256955 A1 | 9/2017 | Addepalli et al. | |
| 2020/0350026 A1 | 11/2020 | Piccardi et al. | |
| 2022/0148663 A1 | 5/2022 | Guo | |

* cited by examiner

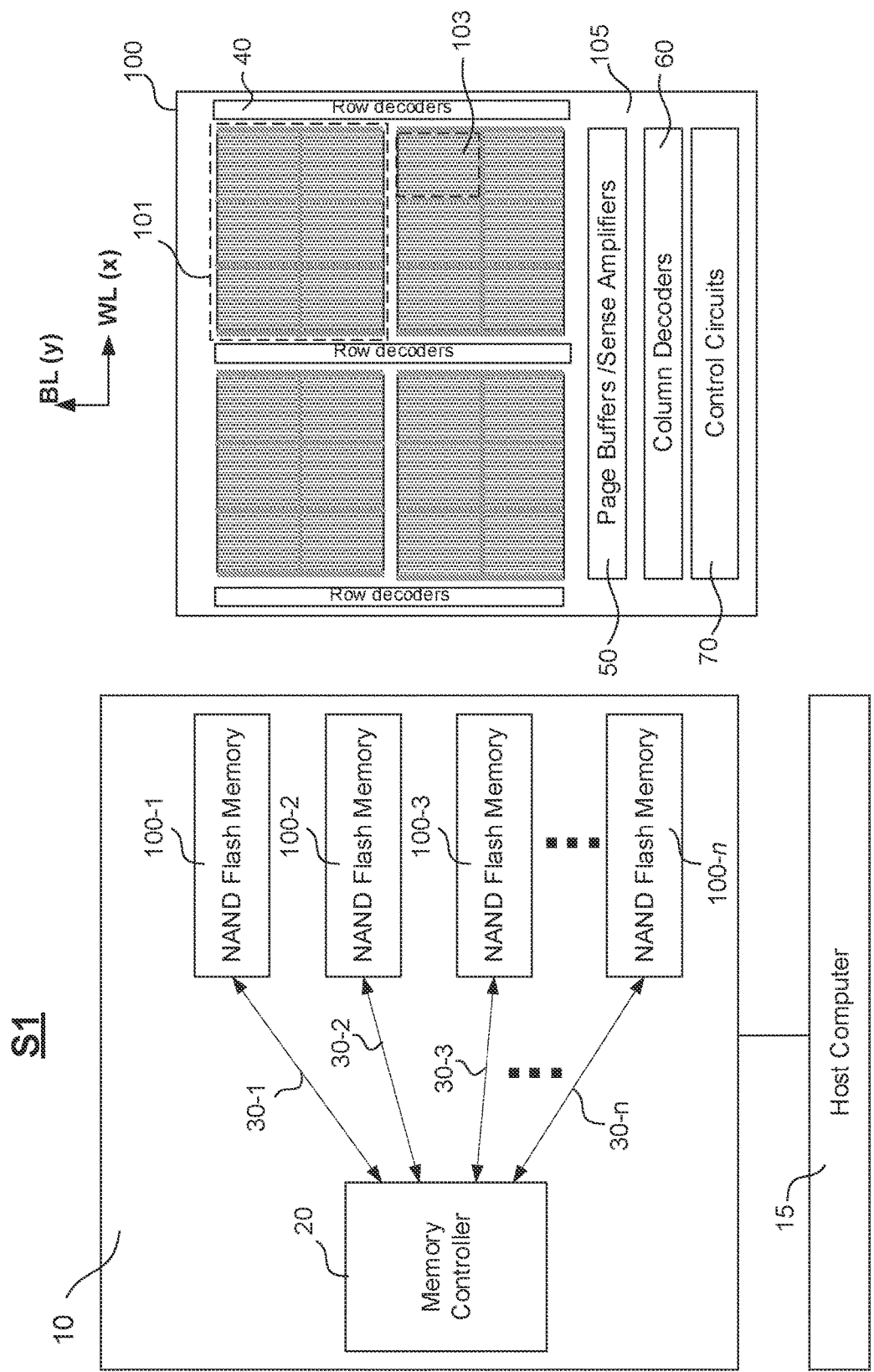

| # of peak power operation ($m$) | electric potential $V_{ppm}$ (V) | reference voltage $V_{ref}$ (V) |
|---|---|---|
| 0 | 1.2 | |
| 1 | 0.8 | 1 |
| 2 | 0.6 | 0.7 |
| 3 | 0.48 | 0.54 |
| 4 | 0.4 | 0.44 |
| $m-1$ | $(R_d/(R_d+(m-1)\cdot R_u))V_{dd}$ | $V_{ref}(m-1)$ |
| $m$ | $(R_d/(R_d+m\cdot R_u))V_{dd}$ | $V_{ref}(m)$ |

FIG. 5

| # of peak power operation (m) | electric potential $V_{ppm}$ (V) | reference voltage $V_{ref}$ (V) |
|---|---|---|
| 0 | 0 | |
| 1 | 0.16 | 0.08 |
| 2 | 0.32 | 0.24 |
| 3 | 0.48 | 0.4 |
| 4 | 0.64 | 0.54 |
| m-1 | $(m-1)*i*Rd$ | $V_{ref}(m-1)$ |
| m | $m*i*Rd$ | $V_{ref}(m)$ |

FIG. 9

| # of peak power operation (m) | electric potential $V_{ppm}$ (V) | reference voltage $V_{ref}$ (V) |
|---|---|---|
| 0 | 0 | |
| 1 | 0.4 | 0.2 |
| 2 | 0.6 | 0.5 |
| 3 | 0.72 | 0.66 |
| 4 | 0.8 | 0.76 |
| m-1 | $(m-1)*V_{dd}*R_d / (R_d*(m-1)+R_u)$ | $V_{ref}(m-1)$ |
| m | $m*V_{dd}*R_d / (m*R_d+R_u)$ | $V_{ref}(m)$ |

FIG. 13

| # of peak power operation ($m$) | electric potential $V_{ppm}$ (V) | reference voltage $V_{ref}$ (V) |
|---|---|---|
| 0 | 1.2 | |
| 1 | 1.04 | 1.12 |
| 2 | 0.88 | 0.96 |
| 3 | 0.72 | 0.8 |
| 4 | 0.56 | 0.66 |
| $m-1$ | $V_{dd} - (m-1)*i*Rd$ | $V_{ref}(m-1)$ |
| $m$ | $V_{dd} - m*i*Rd$ | $V_{ref}(m)$ |

FIG. 16

ANALOG PEAK POWER MANAGEMENT FOR MULTI-DIE OPERATIONS

CROSS-REFERENCE TO RELATED APPLICATIONS AND INCORPORATION BY REFERENCE

This application is a continuation-in-part of U.S. patent application Ser. No. 17/116,253 filed on Dec. 9, 2020 and titled "Analog Peak Power Management for Multi-die Operations," which claims priority to PCT/CN2020/128024 filed on Nov. 11, 2020, all of which are incorporated herein by reference in their entirety.

TECHNICAL FIELD

The present disclosure generally relates to the field of semiconductor technology, and more particularly, to circuit designs and methods for peak power management in a storage system.

BACKGROUND

In many servers and mobile devices, NAND storage system is widely used as the primary non-volatile storage device due to its high storage density and relatively low access latency. However, performance of a high density storage system, for example, a three-dimensional (3D) NAND storage system, is often restricted by the maximum amount of power (or peak current) that it can use. Currently, operations consuming high power (i.e., peak power operations) that are carried out by various memory dies of the NAND storage system, can be staggered by a system controller. Only a limited number of peak power operations can be performed simultaneously. This approach can also result in increased system loading with unnecessary over-management. Communications between different memory dies can be established to coordinate the peak power operations. Currently, coordination between two memory dies can be arranged and peak power operations can be staggered between these two memory dies. When memory dies are grouped into two dies per group, coordination between groups remains an issue. Other approaches can provide multiple memory dies in each group to coordinate peak power operations, but are also limited to one peak power operation in each group. Therefore, it is necessary to optimize the control circuits and peak power management scheme to coordinate multiple memory dies simultaneously to allow multiple peak power operations performed on a storage system. As such, the storage system's power or current budget can be fully utilized.

BRIEF SUMMARY

The present disclosure is directed to providing effective peak power management for a memory storage system.

One aspect of the present disclosure provides a peak power management (PPM) system for a storage system with multiple memory dies. The PPM system includes two or more PPM groups, each of the two or more PPM groups having multiple PPM circuits. Each of the multiple PPM circuits includes a pull-up driver electrically connected to a power source and a pull-up resistor; a pull-down driver electrically connected to a pull-down resistor; and a PPM pin connected to the pull-up resistor and the pull-down resistor. The PPM pins in each of the two or more PPM groups are electrically connected with each other. Each of the two or more PPM groups is configured to manage m number of peak power operations based on an electric potential of the PPM pins, where m is a whole number.

In some implementations, each memory die includes at least one PPM circuit.

In some implementations, the electric potentials of the PPM pins in each of the two or more PPM groups is determined by pull-down currents flowing through the pull-down drivers in the multiple PPM circuits.

In some implementations, each of the two or more PPM groups further includes a comparator with a first input terminal electrically connected to the PPM pins and a second input terminal electrically connected to a reference voltage. An output terminal of the comparator is connected to an inverter.

In some implementations, each of the two or more PPM groups further includes a resistance/capacitance (RC) filter electrically connected to the PPM pins and the first input terminal of the comparator.

In some implementations, the reference voltage is in a range between a first electric potential of the PPM pins and a second electric potential of the PPM pins, the first electric potential and the second electric potential of the PPM pins corresponding to m−1 and m number of peak power operations, respectively.

In some implementations, the first electric potential of the PPM pins is $$\frac{R_d}{R_d + (m-1) \cdot R_u} V_{dd},$$

and the second electric potential of the PPM pins is $$\frac{R_d}{R_d + (m \cdot R_u)} V_{dd},$$

wherein $R_u$ is the resistance of the pull-up resistor; $R_d$ is the resistance of the pull-down resistor; and $V_{dd}$ is the power source voltage.

In some implementations, the pull-up driver is a p-channel metal oxide semiconductor field effect transistor (MOSFET), and the pull-down driver is an n-channel metal oxide semiconductor field effect transistor (MOSFET).

In some implementations, the PPM pins in each PPM group are electrically connected through die-to-die connections, each die-to-die connection comprising a metal interconnect.

In some implementations, the PPM pins in each PPM group are electrically connected through flip-chip bonding, die-to-die bonding, or wire-bonding.

The present disclosure also provides a method of peak power management (PPM) for a storage system with multiple memory dies. Each of the multiple memory dies includes a first PPM circuit and a second PPM circuit. First PPM circuits of the multiple memory dies are electrically connected to form a first PPM group, and second PPM circuits of the multiple memory dies are electrically connected to form a second PPM group. The method includes the following steps: switching on a first pull-down driver of the first PPM circuit on a selected memory die when a first PPM enablement signal of the first PPM group is zero; waiting for a first delay period; switching on a second pull-down driver of the second PPM circuit on the selected memory die when a second PPM enablement signal of the second PPM group is zero; and performing a peak power operation on the selected memory die. The first and second PPM enablement signals depend on the current flowing through each of the pull-down drivers in the first and second PPM groups.

In some implementations, after performing the peak power operation, the second pull-down driver of the second PPM circuit on the selected memory die is switched off.

In some implementations, after switching off the second pull-down driver of the second PPM circuit, the first pull-down driver of the first PPM circuit is switched off.

In some implementations, prior to switching off the first pull-down driver of the first PPM circuit, a second delay period is performed.

In some implementations, the second delay period is a predetermined time period.

In some implementations, the first delay period is a time period unique to the selected memory die among the multiple memory dies on the storage system.

In some implementations, the method further includes polling and checking, repeatedly, the first PPM enablement signal and the second PPM enablement signal when the first PPM enablement signal and/or the first PPM enablement signal is not zero.

In some implementations, the method further includes generating the first PPM enablement signal by comparing a reference voltage with a first electric potential of a first plurality of PPM pins of the first PPM circuits in the first PPM group. The first PPM circuits are electrically connected through the first plurality of PPM pins. The second PPM is configured to generate an enablement signal by comparing the reference voltage with a second electric potential of a second plurality of PPM pins of the second PPM circuits in the second PPM group, wherein the second PPM circuits are electrically connected through the second plurality of PPM pins.

In some implementations, the generating of the first PPM enablement signal further includes setting the first PPM enablement signal to 0 if the first electric potential of the first plurality of PPM pins is higher than the reference voltage. The second PPM is configured to generate an enablement signal further comprises setting the second PPM enablement signal to 0 if the second electric potential of the second plurality of PPM pins is higher than the reference voltage.

In some implementations, the generating of the first PPM enablement signal further comprises setting the first PPM enablement signal to 1 if the first electric potential of the first plurality of PPM pins is less than the reference voltage. The second PPM is configured to generate an enablement signal further comprises setting the second PPM enablement signal to 1 if the second electric potential of the second plurality of PPM pins is less than the reference voltage.

In some implementations, the method also includes selecting the reference voltage based on a maximum m number of peak power operations for the storage system.

In some implementations, the method further includes regulating the first electric potential of the first plurality of PPM pins through the first pull-down driver; and regulating the second electric potential of the second plurality of PPM pins through the second pull-down driver.

Another aspect of the present disclosure provides a peak power management (PPM) circuit for a storage system with multiple memory dies. The PPM circuit includes a pull-up driver electrically connected between a power source and a PPM pin. A pull-down driver is electrically connected between a ground and the PPM pin, wherein the pull-up driver and the pull-down driver are connected in series. The PPM circuit is configured to manage a peak power operation for the memory die based on an electric potential of the PPM pin, wherein PPM pins of PPM circuits on different memory dies are electrically connected.

In some implementations, the PPM circuit further includes a pull-up resistor electrically connected between the power source and the PPM pin, wherein the pull-up resistor is connected in series with the pull-up driver.

In some implementations, the PPM circuit further includes a pull-down resistor electrically connected between the ground and the PPM pin, wherein the pull-down resistor is connected in series with the pull-down driver.

In some implementations, the PPM circuit further includes a pull-up current source electrically connected between the power source and the PPM pin, wherein the pull-up current source is connected in series with the pull-up driver and is configured to provide constant current.

In some implementations, the PPM circuit further includes a pull-down current source electrically connected between the ground and the PPM pin, wherein the pull-down current source is connected in series with the pull-down driver and is configured to provide constant current.

In some implementations, the PPM circuit further includes a comparator with a first input terminal electrically connected to the PPM pin and a second input terminal electrically connected to a reference voltage. The reference voltage is based on a maximum number of peak power operations allowed in the storage system. In some implementations, the PPM circuit further includes an inverter with an input connected to an output terminal of the comparator.

Yet another aspect of the present disclosure discloses a method of peak power management (PPM) for a storage system with multiple memory dies. Each of the multiple memory dies comprises a PPM circuit, and each PPM circuit comprises a pull-up driver connected in series with a pull-down driver. The method includes sending a first control signal to switch on a corresponding pull-up driver on one of the multiple memory dies; sending a second control signal to switch on a respective pull-down driver on a selected memory die based on a PPM enablement signal; and performing a peak power operation on the selected memory die.

In some implementations, the sending of the second control signal includes applying an analog voltage on a gate terminal of the respective pull-down driver.

In some implementations, the method further includes generating a pull-down current proportional to a peak power current for the peak power operation.

In some implementations, the method further includes generating the PPM enablement signal by comparing a reference voltage with an electric potential of a PPM pin of the PPM circuit, wherein PPM pins of PPM circuits on different memory dies are electrically connected.

In some implementations, the method further includes selecting the reference voltage based on a maximum number of peak power operations for the storage system. In some implementations, the method further includes generating, by a pull-down current source, a pull-down current that is proportional to a peak power current for the peak power operation.

The present disclosure further discloses a method of peak power management (PPM) for a storage system with multiple memory dies, wherein each of the multiple memory dies comprises a PPM circuit, and each PPM circuit comprises a pull-up driver connected in series with a pull-down driver. The method includes sending a second control signal to switch on a corresponding pull-down driver on one of the multiple memory dies; sending a first control signal to switch on a respective pull-up driver on a selected memory die based on a PPM enablement signal; and performing a peak power operation on the selected memory die.

In some implementations, the sending of the first control signal comprises applying an analog voltage on a gate terminal of the respective pull-up driver.

In some implementations, the method further includes generating a pull-up current proportional to a peak power current for the peak power operation. In some implementations, the method further includes generating the PPM enablement signal by comparing a reference voltage with an electric potential of a PPM pin of the PPM circuit, wherein PPM pins of PPM circuits on different memory dies are electrically connected.

In some implementations, the method further includes selecting the reference voltage based on a maximum number of peak power operations for the storage system.

In some implementations, the method further includes generating, by a pull-up current source, a pull-up current that is proportional to a peak power current for the peak power operation.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1A illustrates a storage system with one or more NAND flash memories, according to some embodiments of the present disclosure.

FIG. 1B illustrates a top-down view of a memory die, according to some embodiments of the present disclosure.

FIG. 5 illustrates a peak power management scheme, according to some embodiments of the present disclosure.

FIG. 9 illustrates a peak power management scheme, according to some embodiments of the present disclosure.

FIG. 13 illustrates a peak power management scheme, according to some embodiments of the present disclosure.

FIG. 16 illustrates a peak power management scheme, according to some embodiments of the present disclosure.

Figure 1C:
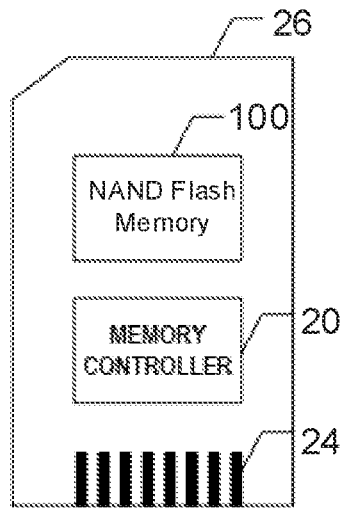
FIGS. 1C and 1D illustrate exemplary storage systems with one or more NAND flash memories, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

FIG. 1A illustrates a block diagram of an exemplary system S1 having a storage system 10, according to some embodiments of the present disclosure. System S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. The storage system 10 (also referred to as a NAND storage system) can include a memory controller 20 and one or more NAND flash memories 100 (e.g., 100-1, 100-2, 100-3, . . . , 100-n). The storage system 10 can communicate with a host computer 15 through the memory controller 20, where the memory controller 20 can be connected to the one or more NAND flash memories 100-1, 100-2, 100-3, . . . , 100-n, via one or more memory channels 30 (e.g., 30-1, 30-2, 30-3, . . . , 30-n). In some embodiments, each NAND flash memory 100 can be managed by the memory controller 20 via a memory channel 30.

In some embodiments, the host computer 15 can include a processor of an electronic device, such as a central processing unit (CPU), or a system-on-chip (SoC), such as an application processor (AP). The host computer 15 sends data to be stored at the storage system 10 or retrieves data by reading the storage system 10. The memory controller 20 can handle I/O requests received from the host computer 15, ensure data integrity and efficient storage, and manage the NAND flash memory 100. The memory channels 30 can provide data and control communication between the memory controller 20 and each NAND flash memory 100 via a data bus. The memory controller 20 can select one of the NAND flash memory 100 according to a chip enable signal.

FIG. 1B illustrates a top-down view of a NAND flash memory 100, according to some embodiments of the present disclosure. The NAND flash memory 100 can be a memory die (or a die) or any portion of a memory die. In some embodiments, each NAND flash memory 100 can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1B, the exemplary NAND flash memory 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1B. In this disclosure, the memory block 103 is also referred to as the "memory array" or "array." The memory array is the core area on a memory die, performing storage functions.

The NAND flash memory 100 also includes a peripheral region 105, an area surrounding memory planes 101. The peripheral region 105 contains periphery circuits, which include many digital, analog, and/or mixed-signal circuits to support functions of the memory array, for example, page buffers/sense amplifiers 50, row decoders 40, column decoders 60, and control circuits 70. Control circuits 70 include MCU, state machine, register, active and/or passive semiconductor devices, such as transistors, diodes, capacitors, resistors, etc. The control circuits 70 of the peripheral region 105 can be configured to initiate a program operation on a select memory cell of a NAND memory string in the memory block 103. In some implementations, the control circuits 70 can receive a command (e.g., a program/read/erase command) from a memory controller (e.g., the memory controller 20) through a communication interface of the NAND flash memory 100, and in response, sends control signals to at least row decoder/word line driver, column decoder/bit line driver, and voltage generator deposed in the peripheral region 105 to initiate the program/read/erase operation on the select memory cell.

It is noted that the layout of the electronic components in the storage system 10 and the NAND flash memory 100 in FIGS. 1A and 1B are shown as examples. The storage system 10 and the NAND flash memory 100 can have other layout and can include additional components. For example, the NAND flash memory 100 can also have high-voltage charge pumps, I/O circuits, etc. The storage system 10 can also include firmware, data scrambler, etc.

Figure 1D:
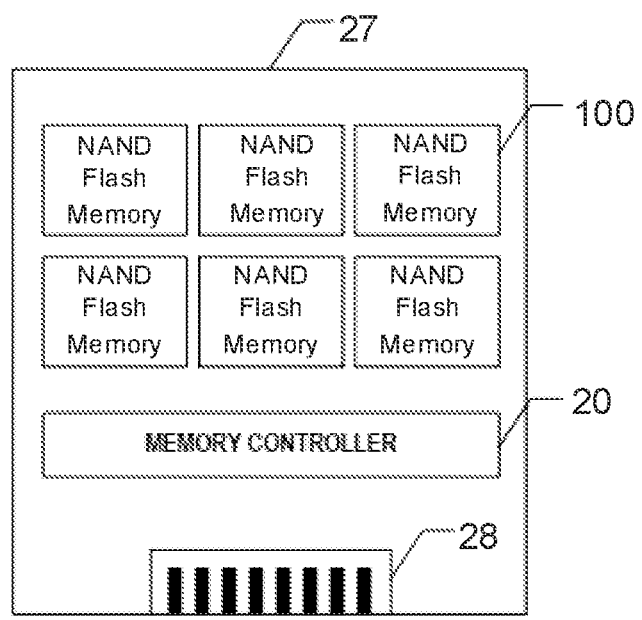

Memory controller 20 and one or more NAND flash memory 100 can be integrated into various types of storage devices, for example, be included in the same package, such as a universal Flash storage (UFS) package or an eMMC package. That is, storage system 10 can be implemented and packaged into different types of end electronic products. In one example as shown in FIG. 1C, memory controller 20 and a single NAND flash memory 100 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1A). In another example as shown in FIG. 1D, memory controller 20 and multiple NAND flash memories 100 can be integrated into a solid state drive (SSD) 27. SSD 27 can further include an SSD connector 28 coupling SSD 27 with a host (e.g., the host computer 15 in FIG. 1A).

Figure 2:
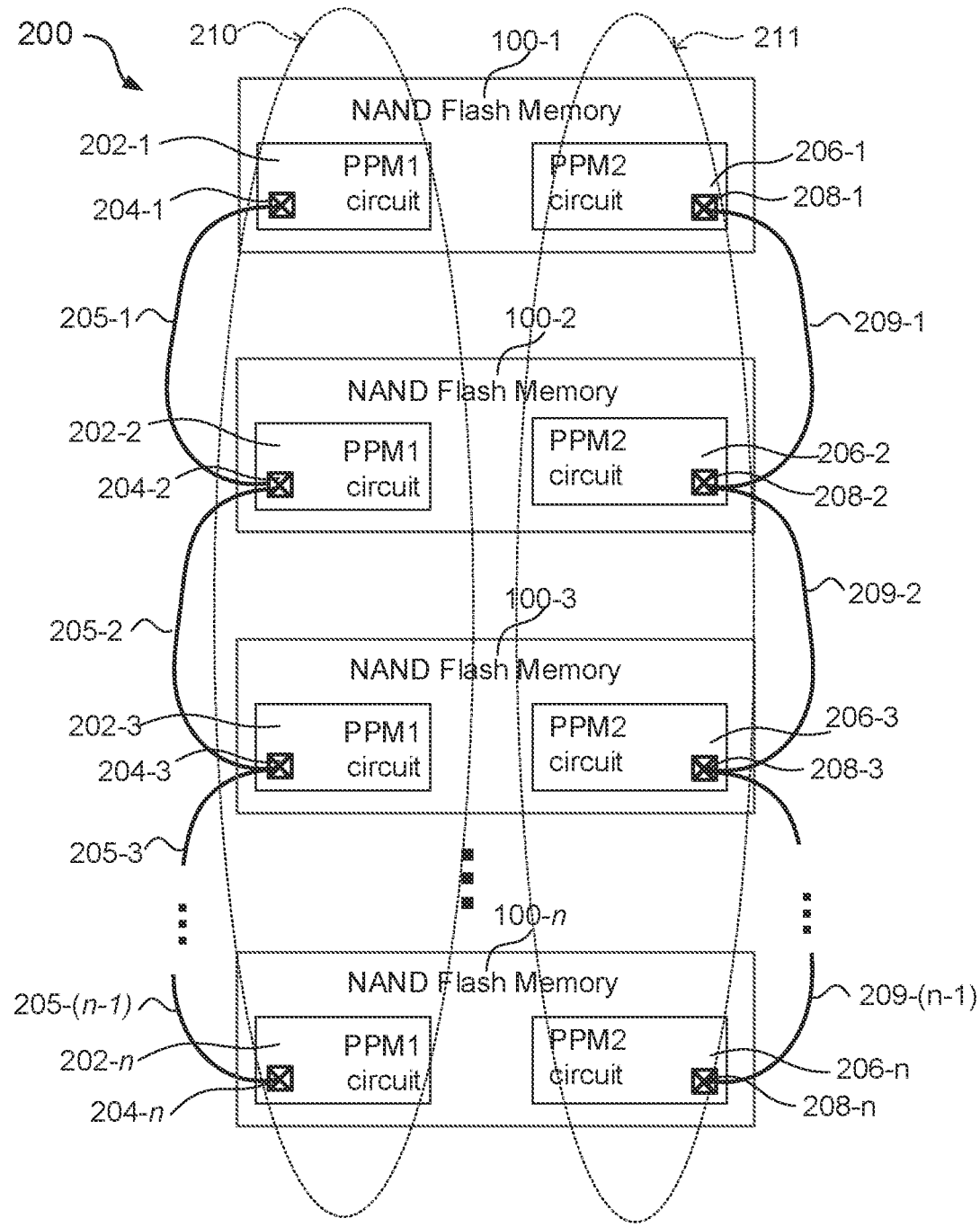
FIG. 2 illustrates a peak power management system in a storage system, according to some embodiments of the present disclosure.

FIG. 2 illustrates a peak power management system 200, according to some embodiments of the present disclosure. The peak power management (PPM) system 200 can be implemented in the storage system 10 in FIG. 1A, having a plurality of memory dies 100-1, 100-2, 100-3, . . . , 100-n, and each memory die can be similar to the NAND flash memory 100 discussed previously in reference with FIG. 1B. In some embodiments, each NAND flash memory 100 can include at least one peak power management (PPM) circuit. In the example shown in FIG. 2, each NAND flash memory 100 includes a first PPM (PPM1) circuit 202 and a second PPM (PPM2) circuit 206. Each PPM1 circuit and each PPM2 circuit can include a PPM contact pad (also referred to as PPM pin). For example, each PPM1 circuit 202 includes a PPM1 pin 204 (also referred to as PPM1 pin), and each PPM2 circuit 206 includes a PPM2 pin 208 (also referred to as PPM2 pin). The PPM1 circuits 202-1, 202-2, 202-3, . . . , 202-n on different NAND flash memories 100-1, 100-2, 100-3, . . . , 100-n can communicate with each other through the PPM1 pins 204-1, 204-2, 204-3, . . . , 204-n. The PPM2 circuits 206-1, 206-2, 206-3, . . . , 206-n on different NAND flash memories 100-1, 100-2, 100-3, . . . , 100-n can communicate with each other through the PPM2 pins 208-1, 208-2, 208-3, . . . , 208-n. In some embodiments, the PPM pins between different NAND flash memories 100 can be electrically connected with each other through a plurality of die-to-die connections. For example, the PPM1 pins 204 between different NAND flash memories 100 can be electrically connected with each other through first die-to-die connections 205, and are thereby also referred to as a first PPM group 210 (or PPM1 group). Likewise, the PPM2 pins 208 between different NAND flash memories 100 can be electrically connected with each other through second die-to-die connections 209, and are thereby also referred to as a second PPM group 211 (or PPM2 group). In some embodiments, the first and second die-to-die connections 205 and 209 can be a metal wire formed through wire-bonding. In some embodiments, the first and second die-to-die connections 205 and 209 can be metal wires or any suitable metal or conductive material formed through flip-chip bonding or any suitable die-to-die bonding. In some embodiments, the first and second die-to-die connections 205 and 209 can be formed by through-silicon VIAs (e.g., through-array structures).

By using the die-to-die connections described above, communications between different memory dies (i.e., NAND flash memories 100-1, 100-2, 100-3, . . . , 100-n) can be established in the storage system. As such, the storage system 10 can send operation commands to any number of memory dies at any time while the PPM1 circuits 202 and the PPM2 circuits 206 can control the system's power consumption by selecting one or more memory dies. In one example, each memory die shown in FIGS. 1A-1B and 2 can have the communication interface, where commands from the memory controller 20 can be received by the control circuit 70 of each memory die. In some embodiments, the first PPM (PPM1) circuit 202 and the second PPM (PPM2) circuit 206 can be implemented in the peripheral region 105 on a memory die, where the control circuits 70 of the memory die can send control signals to the first PPM (PPM1) circuit 202 and the second PPM (PPM2) circuit 206 on the memory die in response to the commands received at the communication interface. In some embodiments, the commands received at the communication interface include a PPM circuit selecting signal for selecting the PPM1 circuit 202 and/or the PPM2 circuit 206 on a particular memory die.

Figure 3:
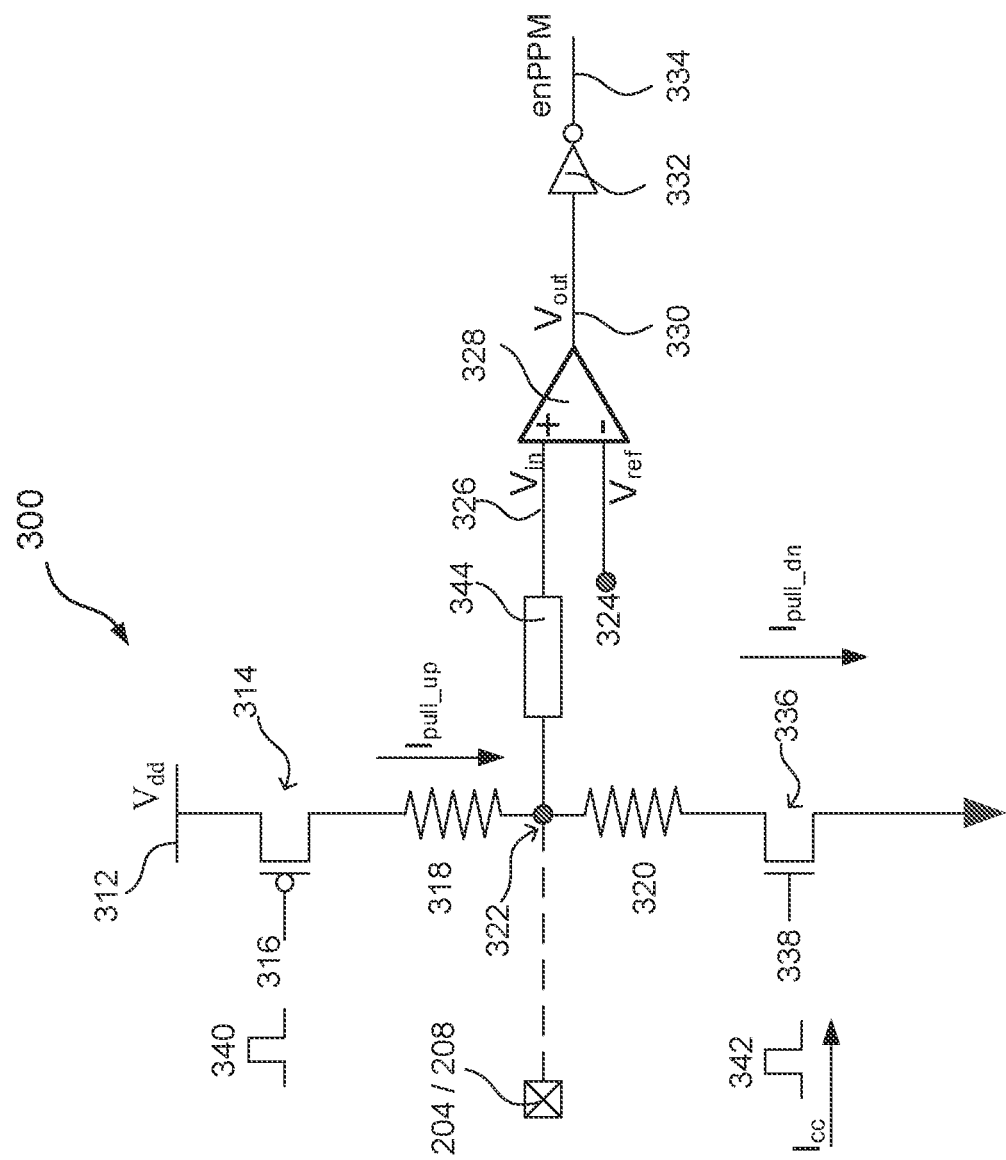
FIG. 3 illustrates a peak power management circuit, according to some embodiments of the present disclosure.

FIG. 3 illustrates an exemplary PPM circuit 300 provided in each of the NAND flash memories 100, according to some embodiments of the present disclosure, where each of the PPM1 circuits 202 and each of the PPM2 circuits 206 shown in FIG. 2 can be similar to the PPM circuit 300. The PPM circuit 300 can include a pull-up driver 314, where one terminal of the pull-up driver 314 is connected to a power source 312 with a voltage $V_{dd}$. In some embodiments, the power source 312 can be any suitable power supply that has desired noise sensitivity. In some embodiments, the pull-up driver 314 can be a transistor, for example, a metal-oxide-semiconductor-field-effect-transistor (MOSFET). In some embodiments, the pull-up driver 314 can be a p-channel MOSFET (i.e., pFET), where a source terminal of the pull-up driver 314 can be connected to the power source 312 and a drain terminal of the pull-up driver 314 can be connected to a pull-up resistor 318 with a resistance $R_u$.

In some embodiments, the PPM circuit 300 also includes a pull-down driver 336. In some embodiments, the pull-down driver 336 can be a transistor, for example, a MOSFET. In some embodiments, the pull-down driver 336 can be an n-channel MOSFET (i.e., nFET). A source terminal of the pull-down driver 336 can be grounded, and a drain terminal of the pull-down driver 336 can be connected to a pull-down resistor 320 with a resistance $R_d$.

In some embodiments, the pull-up resistor 318 and the pull-down resistor 320 are electrically connected in series at a node 322, where the PPM contact pad (e.g., the PPM1 pin 204 or the PPM2 pin 208 in FIG. 2) can be electrically connected to the node 322. As described previously, all the PPM contact pads (e.g., the PPM1 pins 204) in one PPM group (e.g., the PPM1 group 210) can be electrically connected through the die-to-die connections (e.g., the first die-to-die connection 205). Thus, all the PPM contact pads of the same PPM group can be held to an electrical potential $V_{ppm}$ at the node 322.

In some embodiments, the PPM circuit 300 can also include an output circuit including a comparator 328, with a first input terminal 324 at a reference voltage $V_{ref}$ and a second input terminal 326 connected to the node 322. The comparator 328 can be an operational amplifier used for comparing an input voltage $V_{in}$ at the second input terminal 326 with the reference voltage $V_{ref}$ at the first input terminal 324, where an output voltage $V_{out}$ at an output terminal 330 can indicate whether the input voltage $V_{in}$ is above or below the reference voltage $V_{ref}$. For example, the output voltage $V_{out}$ can be a positive voltage when the input voltage $V_{in}$ is larger than the reference voltage $V_{ref}$. On the other hand, the output voltage $V_{out}$ can be a negative voltage when the input voltage $V_{in}$ is smaller than the reference voltage $V_{ref}$. In some embodiments, the comparator 328 can be an analog comparator.

In some embodiments, the output circuit of the PPM circuit 300 can further include an inverter 332 with an input terminal connected to the output terminal 330 of the comparator 328. The inverter 332 can invert an input signal. For example, when the output voltage $V_{out}$ of the comparator 328 is a positive voltage, a PPM enablement signal enPPM generated by the inverter 332 at an output terminal 334 can be a logic zero, i.e., the PPM enablement signal enPPM=0. On the other hand, when the output voltage $V_{out}$ of the comparator 328 is a negative voltage, the PPM enablement signal enPPM can be a logic one, i.e., enPPM=1. In the other words, when the electrical potential $V_{ppm}$ at the node 322 is larger than the reference voltage $V_{ref}$ (i.e., $V_{ppm} > V_{ref}$), the PPM enablement signal enPPM=0. When the electrical potential $V_{ppm}$ at the node 322 is smaller than the reference voltage $V_{ref}$ (i.e., $V_{ppm} < V_{ref}$), the PPM enablement signal enPPM=1.

In some embodiments, the output circuit can also include an optional RC filter 344 connected between the node 322 and the second input terminal 326 of the comparator 328. The RC filter 344 can be used to filter out unwanted signals within a certain frequency range.

As discussed previously, all the PPM pins of the same PPM group are electrically connected, i.e., all the PPM pins of the same PPM group have the same electrical potential $V_{ppm}$. Therefore, each PPM group only needs one comparator 328 electrically connected at the node 322. And the PPM enablement signal enPPM indicates the electrical potential $V_{ppm}$ for the PPM group. In the example shown in FIG. 2, the PPM enablement signals for the PPM1 group 210 and the PPM2 group 211 can thereby be presented by the PPM enablement signal enPPM1 and the PPM enablement signal enPPM2, respectively.

It is noted that the resistance $R_u$ and $R_d$, the characteristic of the pull-up driver 314 and the pull-down driver 336, the electrical potential $V_{ppm}$ at node 322 are not necessary to be the same between the PPM1 circuit 202 and the PPM2 circuit 206 shown in FIG. 2. The symbols used for the exemplary PPM circuit 300 are only for illustration purpose and for simplicity to demonstrate the functionality of the PPM circuits.

In some embodiments, the pull-down driver 336 can be replaced by any suitable device that can be implemented as a current source with a pre-determined current level.

During operation, a first control signal 340 can be sent to a gate terminal 316 of the pull-up driver 314 to switch the pull-up driver 314 on or off. For example, if the first control signal 340 has a voltage less than a threshold voltage of the pull-up driver 314, the pull-up driver 314 can be switched on, and a conductive path can be formed from the power source 312 to the pull-up resistor 318. The current flowing through the pull-up driver 314 and the pull-up resistor 318 is also referred to as the pull-up current $I_{pull\_up}$. If the first control signal 340 has a voltage higher than the threshold voltage of the pull-up driver 314, the pull-up driver 314 can be switched off.

When a second control signal 342 is sent to a gate terminal 338 of the pull-down driver 336, the pull-down driver 336 can be switched on or off. For example, if the second control signal 342 has a voltage higher than a threshold voltage of the pull-down driver 336, the pull-down driver 336 can be switched on, and a conductive path can be formed from the pull-down resistor 320 to the ground. If the second control signal 342 has a voltage less than the threshold voltage of the pull-down driver 336, the pull-down driver 336 can be switched off.

In some embodiments, the pull-down driver 336 can be operated as a current controller. In this example, when the pull-down driver 336 is switched on, the magnitude of the current flowing through the pull-down resistor 320 (also referred to as pull-down current $I_{pull\_dn}$) depends on the second control signal 342. When the pull-down driver 336 is an nFET, as shown in FIG. 3, the pull-down current $I_{pull\_dn}$ can be determined by the voltage level of the second control signal 342 and the trans-conductance of the pull-down driver 336. The pull-down driver 336 can be switched on or off to signal whether there is a peak power operation performed on the memory die. For example, the voltage level of the second control signal 342 can correspond to a peak current $I_{cc}$ used during the peak power operation. As such, when the memory die is performing the peak power operation, the pull-down driver 336 can be switched on accordingly.

According to another embodiment of the present disclosure, a peak current $I_{cc}$ of a memory die (e.g., the NAND flash memory 100-1) can correspond to the voltage level of the second control signal 342, and thereby correspond to the pull-down current $I_{pull\_dn}$. Therefore, the pull-down current $I_{pull\_dn}$ can function as a current mirror of the peak current $I_{cc}$ of the memory die. In some embodiments, the pull-down current $I_{pull\_dn}$ can be proportional to the peak current $I_{cc}$. The pull-down current $I_{pull\_dn}$ can be scaled down from the peak current $I_{cc}$, a high current level needed by the memory die to perform a peak power operation. For example, if the memory die needs 200 mA of current to perform a peak power operation, the pull-down current $I_{pull\_dn}$ can be 20 µA. Therefore, the peak power operations can be regulated for each memory die through the pull-down current $I_{pull\_dn}$. Furthermore, through the die-to-die connections at the PPM contact pads, peak power operations throughout the entire storage system can be coordinated between different memory dies.

During operation, according to some embodiments of the present disclosure, only one pull-up driver 314 is switched on (i.e., enabled) within each PPM group (e.g., within the PPM1 group 210 or the PPM2 group 211 in FIG. 2) and the other pull-up drivers 314 in the same PPM group are switched off. In one example, each of the plurality of memory dies 100-1, 100-2, 100-3, . . . , 100-n in FIG. 2 can receive a command from the memory controller 20 (as shown in FIG. 1) through a respective communication interface on each memory die. In some embodiments, the command received at the communication interface includes the PPM circuit selecting signal for selecting the PPM1 circuit 202 and/or the PPM2 circuit 206 on the memory die. In response to the PPM circuit selecting signal, the control circuits 70 of the selected memory die can also send control signals (e.g., the first control signal 340 and the second control signal 342) to the PPM1 circuit 202 and/or the PPM2 circuit 206 on the selected memory die. In this example, the first control signal 340 can be sent by the control circuits 70 to switch on or off the pull-up driver 314 of the PPM1 circuit 202 and/or the PPM2 circuit 206 on the particular memory die. For example, if a memory die is selected according to the PPM circuit selecting signal, the control circuits 70 of the selected memory die can send the first control signal 340 having a voltage less than a threshold voltage of the pull-up driver 314 to switch on the pull-up driver 314. Otherwise, if a memory die does not receive the PPM circuit selecting signal at the communication interface, the control circuits 70 of the particular memory die can send the first control signal 340 having a voltage higher than a threshold voltage of the pull-up driver 314 to switch off the pull-up driver 314. As such, current only flows from the power source 312 through one pull-up resistor 318 of the particular memory die in each PPM group. During operation, the pull-down driver 336 can be switched on or off depending on the status of the memory die, and can be independently controlled according to the PPM management scheme discussed below. For example, the NAND flash memory 100-1 (in FIG. 2) can perform a peak power operation using the peak current $I_{cc}$ when enPPM=0; correspondingly, the pull-down driver 336 of the PPM1 circuit 202-1 is switched on, where a conductive path can be formed from the pull-down resistor 320 through the pull-down driver 336 to the ground. The NAND flash memories 100-1 is prohibited from performing any peak power operation when enPPM=1; correspondingly, the pull-down driver 336 of the PPM1 circuit 202-1 is switched off, where no current can flow through the pull-down driver 336 on the NAND flash memory 100-1.

The electric potential $V_{ppm}$ of the node 322 (or the PPM pins) depends on the number of pull-down drivers 336 that are switched on in each PPM group. Because the pull-down driver 336 is switched on when peak power operation can be performed on a memory die, by monitoring the electric potential $V_{ppm}$, the number of peak power operations performed in a storage system having multiple memory dies can thereby be regulated.

Figure 4:
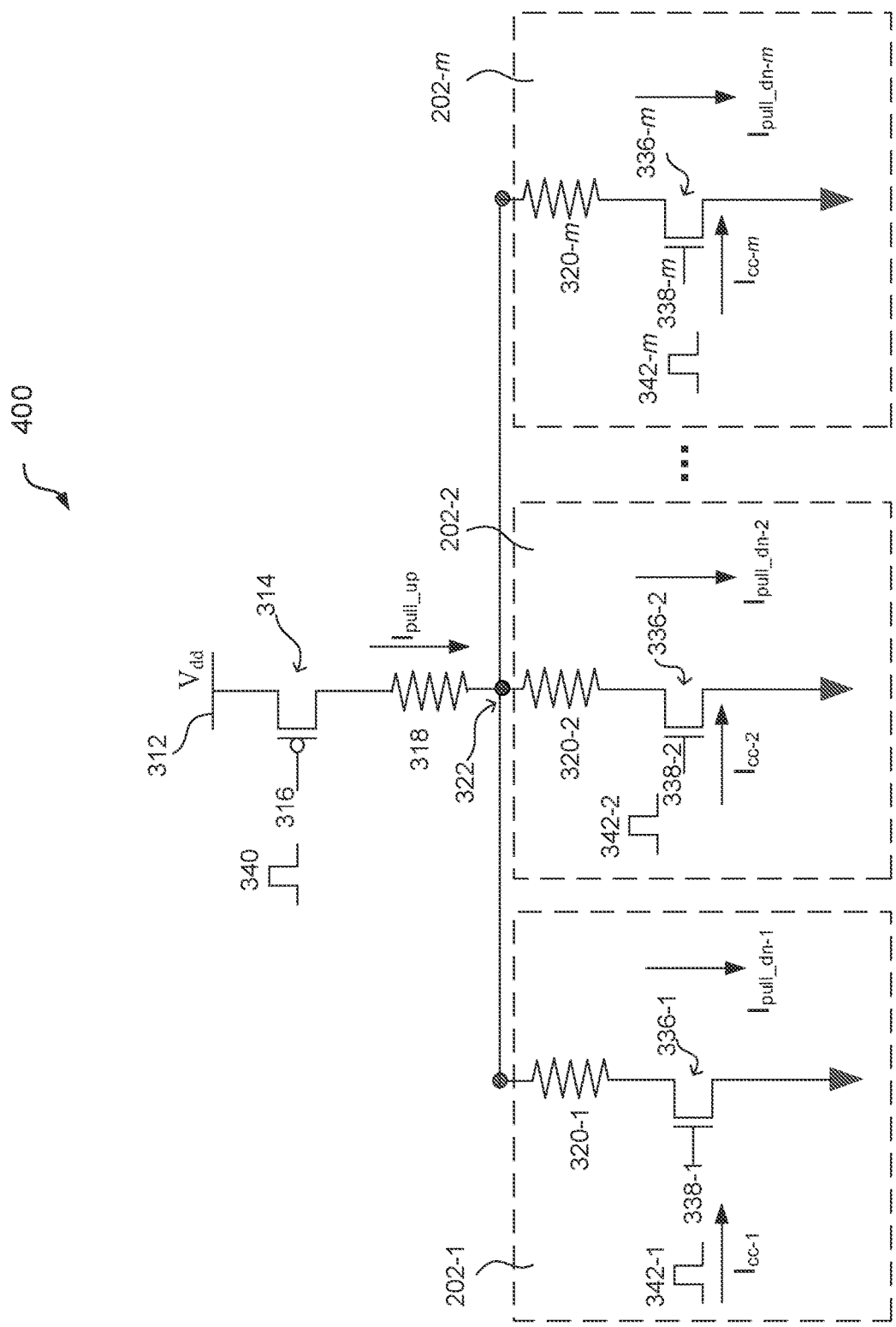
FIG. 4 illustrates an equivalent circuit of a peak power management group, according to some embodiments of the present disclosure.

FIG. 4 shows an equivalent circuit 400 of a PPM group using the PPM circuit 300 in FIG. 3, according to some embodiments of the present disclosure. The PPM group can be the PPM1 group 210 or the PPM2 group 211 in the storage system in FIG. 2. Since only the pull-up driver 314 and the pull-down drivers 336 that are switched on can form conductive paths, FIG. 4 omits those pull-up drivers 314 and pull-down drivers 336 that are switched off. As discussed previously, the node 322 is electrically connected to the PPM pin on each of the memory die in the PPM group, and all the PPM pins in the same PPM group are electrically connected between different memory dies. The node 322 can be held at the same electrical potential $V_{ppm}$ in the entire PPM group between different memory dies, and is illustrated as one intersection point to the pull-up resistor 318 in FIG. 4.

In some embodiments, only one pull-up driver 314 is selected to be switched on in one PPM group for peak power management. In some embodiments, the pull-down driver 336 is switched on in the PPM circuit corresponding to the memory die performing the peak power operation, i.e., using the peak current $I_{cc}$, or using a current greater than a threshold predetermined in the NAND flash memory 100 or the storage system 10.

In one example, there can be m number of peak power operations in the storage system 10, where m can be any whole number. For illustration purpose, it is assumed that one memory die can perform one peak power operation. Thus, there can be m number of memory dies (e.g., NAND flash memory 100-1, 100-2, ..., 100-m in FIG. 2) performing peak power operations simultaneously in the storage system 10. The pull-down drivers 336 in the same PPM group are connected in parallel with each other. In this configuration, the pull-up current $I_{pull\_up}$ flowing through the pull-up driver 314 that is switched on, is the sum of the pull-down current $I_{pull\_dn}$ (e.g., $I_{pull\_dn-1}$, $I_{pull\_dn-2}$, ..., $I_{pull\_dn-m}$) flowing through each of the pull-down drivers 336 that are switched on. The equivalent circuit 400 functions as a voltage divider, and the electric potential $V_{ppm}$ of the node 322 can be expressed as a function of m, the number of peak power operation, i.e., the number of memory dies performing peak power operations if one memory die performs one peak power operation:

$$V_{ppm}(m) = \frac{R_d}{R_d + m \cdot R_u} V_{dd} \quad (1)$$

where $R_d$ and $R_u$ are the resistances of the pull-down resistor 320 and pull-up resistor 318, respectively, and the power source 312 provides the voltage $V_{dd}$. In this example, the electric potential $V_{ppm}$ decreases when m, the number of peak power operations, increases. As the number of peak power operations (i.e., the variable m) changes continuously, the electric potential $V_{ppm}$ changes continuously accordingly. As such, through an analog circuit like the PPM circuit 300, information about the peak power operations in each PPM group can be encoded into the electric potential $V_{ppm}$ of the PPM pins in an analog way.

FIG. 5 illustrates an exemplary peak power management scheme, according to some embodiments of the present disclosure. In this example, the voltage $V_{dd}$ of the power source 312 is assumed to be 1.2 V. The resistance $R_d$ of the pull-down resistor 320 is assumed to be twice as much as the resistance $R_u$ of the pull-up resistor 318. It is noted that the assumptions of the voltage $V_{dd}$ and the resistances $R_u$ and $R_d$ are chosen to provide an illustration of the principles of the peak power management scheme in the present disclosure. A person of ordinary skill in the art can utilize the principle of the peak power management scheme described here with various modifications as suitable for the practical applications. All such modifications and variations are within the scope of the present disclosure.

Referring to FIGS. 4 and 5, at the beginning of peak power management, any one of the pull-up drivers 314 in the respective PPM group can be switched on. If there is no memory die performing peak power operation, none of the pull-down driver 336 is switched on. The electric potential $V_{ppm}$ of the node 322 is set to the voltage $V_{dd}$ of the power source 312 through the conductive path established by the specific pull-up driver 314 that is switched on. If $V_{dd}$=1.2V, then $V_{ppm}$ (0)=1.2 V (at m=0).

When one of the memory dies, e.g., the NAND flash memory 100-1 (in FIG. 2), is performing the peak power operation, the memory die consumes the peak current $I_{cc-1}$. As discussed previously, the second control signal 342-1 can be generated to switch on the pull-down driver 336-1 to enable the peak power operation on the NAND flash memory 100-1. As such, the pull-down current $I_{pull\_dn-1}$ can flow through the pull-down driver 336-1 and the pull-down resistor 320-1. The electric potential $V_{ppm}$ at the node 322 is changed to $$V_{ppm}(1) = \frac{R_d}{R_d + R_u} V_{dd} (\text{at } m = 1).$$

Assuming the resistance $R_d$ is twice as much as the resistance $R_u$, the electric potential $V_{ppm}(1)=\frac{2}{3}V_{dd}$=0.8 V.

When another memory die, e.g., the NAND flash memory 100-2 (in FIG. 2), is also performing the peak power operation, there are two memory dies (m=2) in the storage system 10 are now using the peak current $I_{cc}$, i.e., the peak current $I_{cc-1}$ on the NAND flash memory 100-1 and the peak current $I_{cc-2}$ on the NAND flash memory 100-2. In some embodiments, the peak current $I_{cc-1}$ of the NAND flash memory 100-1 and the peak current $I_{cc-2}$ of the NAND flash memory 100-2 can be the same. In some embodiments, the peak current $I_{cc-1}$ of the NAND flash memory 100-1 and the peak current $I_{cc-2}$ of the NAND flash memory 100-2 can be the different. As discussed previously, the second control signal 342-2 can be generated to switch on the pull-down driver 336-2 to enable the peak power operation on the NAND flash memory 100-2. As such, the pull-down current $I_{pull\_dn-2}$ can flow through the pull-down driver 336-2 and the pull-down resistor 320-2. The pull-down current $I_{pull\_dn-1}$ and the pull-down current $I_{pull\_dn-2}$ flow through the pull-down resistor 320-1 and the pull-down resistor 320-2, respectively, where the pull-down resistor 320-1 and the pull-down resistor 320-2 are connected in parallel. The electric potential $V_{ppm}$ at the node 322 is then changed to $$V_{ppm}(2) = \frac{R_d}{R_d + 2 \cdot R_u} V_{dd} (\text{at } m = 2).$$

If assuming that the resistance $R_d$ is twice as much as the resistance $R_u$, the electric potential $V_{ppm}(2)=\frac{1}{2}V_{dd}$=0.6 V.

When a third memory die, e.g., the NAND flash memory 100-3 (in FIG. 2), is also performing the peak power operation, i.e., three memory dies (m=3) in the storage system 10 are consuming the peak current $I_{cc}$, the electric potential $V_{ppm}$ at the node 322 is then changed to $$V_{ppm}(3) = \frac{R_d}{R_d + 3 \cdot R_u} V_{dd} (\text{at } m = 3).$$

If assuming that the resistance $R_d$ is twice as much as the resistance $R_u$, the electric potential $V_{ppm}(3)=\frac{2}{5}V_{dd}$=0.48 V.

Using the Equation (1), the electric potential $V_{ppm}$ can be calculated if four memory dies (m=4) in the storage system 10 are using the peak current $I_{cc}$, i.e. performing the peak power operations. The electric potential $$V_{ppm}(4) = \frac{R_d}{R_d + 4 \cdot R_u} V_{dd};$$

or $V_{ppm}(4)=\frac{1}{3}V_{dd}=0.4$ V (if $V_{dd}=1.2$V, $R_d=2R_u$). The electric potentials $V_{ppm}(m)$ are listed in FIG. 5 for various number of peak power operations (i.e., 0, 1, 2, 3, 4, ..., m−1, m).

As discussed above, the electric potential $V_{ppm}$ of a PPM group depends on the number m of peak power operations. According to Equation (1) and FIG. 5, the electric potential $V_{ppm}$ decreases when the number of the peak power operations increases. Therefore, the reference voltage $V_{ref}$ for the comparator 328 (in FIG. 3) can be chosen such that the PPM enablement signal enPPM can be set at logic zero, i.e., enPPM=0 when the electric potential $V_{ppm}$ is higher than the reference voltage $V_{ref}$, i.e., when the number of memory dies performing peak power operations is less than a predetermined number. And the PPM enablement signal enPPM can be set at logic one, i.e., enPPM=1 when the electric potential $V_{ppm}$ is not higher than the reference voltage $V_{ref}$, i.e., when the number of memory dies performing peak power operations has reached (equal or greater than) the predetermined number. In the other words, the reference voltage $V_{ref}$ can be programmed to correspond to the maximum number of peak power operations allowed in a storage system. Accordingly, when the PPM enablement signal enPPM=0, the storage system can still provide additional peak current $I_{cc}$ to at least one of the memory dies, i.e., having enough power (or current) to provide at least one additional memory die to perform peak power operation. On the contrary, when the PPM enablement signal enPPM=1, the maximum number of peak power operations have been reached for the storage system. The storage system has reached its power (or current) limit and cannot provide additional peak current $I_{cc}$ to any of the memory dies to perform any additional peak power operation.

For a storage system where each memory die includes more than one PPM group, one reference voltage $V_{ref}$ can be chosen for each PPM group to output a PPM enablement signal enPPM for controlling a maximum number of peak power operations. In the example of the storage system in FIG. 2, the PPM1 group can have a reference voltage $V_{ref-1}$ programed to correspond to a number $m_1$—the maximum number of peak power operations allowed in the PPM1 group. Similarly, the PPM2 group can have a reference voltage $V_{ref-2}$ programed to correspond to a number $m_2$—the maximum number of peak power operations allowed in the PPM2 group.

For illustration purpose below, it is assumed that the maximum number of peak power operations in a storage system (or in each memory group) is the number m, and each memory die can perform a peak power operation at a time. It is noted that these assumptions are chosen for simplicity and should not limit the scope of this disclosure. For example, each memory die can perform two or more peak power operations simultaneously.

According to Equation (1), if there are m−1 number of peak power operations, the electric potential $V_{ppm}$ can be expressed as:

$$V_{ppm}(m-1) = \frac{R_d}{R_d + (m-1) \cdot R_u} V_{dd} \quad (2)$$

Thus, the reference voltage $V_{ref}(m)$, corresponding to the maximum number m of peak power operations, can be set to a voltage in a range between the electric potential $V_{ppm}(m)$ and the electric potential $V_{ppm}(m-1)$:

$$\frac{R_d}{R_d + m \cdot R_u} V_{dd} < V_{ref}(m) < \frac{R_d}{R_d + (m-1) \cdot R_u} V_{dd} \quad (3)$$

In the example shown in FIG. 5, if the maximum number of peak power operations allowed is 2, the reference voltage $V_{ref}$ can be a voltage in a range between $V_{ppm}(2)=0.6$ V and $V_{ppm}(1)=0.8$ V, where $V_{ref}(2)=0.7$ V is chosen in FIG. 5 as an example. If the electric potential $V_{ppm}$ is higher than the reference voltage $V_{ref}=0.7$ V, the PPM enablement signal enPPM=0 is generated at the output terminal 334 (see FIG. 3), indicating that the number of peak power operations is 0 or 1, less than the maximum number of 2. The storage system can have at least one additional peak power operation performed by at least one of the memory dies. When there are two peak power operations performed simultaneously, i.e., two memory dies are consuming the peak current $I_{cc}$, the electric potential $V_{ppm}=0.6$ V, lower than the reference voltage $V_{ref}=0.7$ V. The PPM enablement signal enPPM=1 is generated accordingly, indicating that the maximum number of peak power operations of 2 has been reached. The NAND storage system/the PPM group can then prohibit or disenable additional memory die to perform a peak power operation. As such, the PPM enablement signal enPPM can function as an indicator for the number of peak power operations performed in the storage system with multiple memory dies. Through analog PPM circuit 300 and voltages (e.g., analog voltages) associated with the electric potential $V_{ppm}$, the reference voltage $V_{ref}$, the second control signal 342, etc., multiple peak power operations can be controlled simultaneously.

As discussed above, the PPM enablement signal enPPM for each PPM group can be generated by comparing the reference voltage $V_{ref}$ with the electric potential $V_{ppm}$ of the PPM pins (or at the node 322) that are electrically connected between the memory dies. The PPM enablement signal enPPM is set to 0 if the electric potential $V_{ppm}$ of the PPM pins is higher than the reference voltage $V_{ref}$. The PPM enablement signal enPPM is set to 1 if the electric potential $V_{ppm}$ of the PPM pins is not higher than the reference voltage $V_{ref}$. Because the electric potential $V_{ppm}$ depends on the status of the pull-down drivers in the PPM group, and the pull-down driver is switched on when peak power operation is performed on the corresponding memory die, thus the reference voltage can be selected based on a maximum m number of peak power operations for the storage system.

Figure 6:
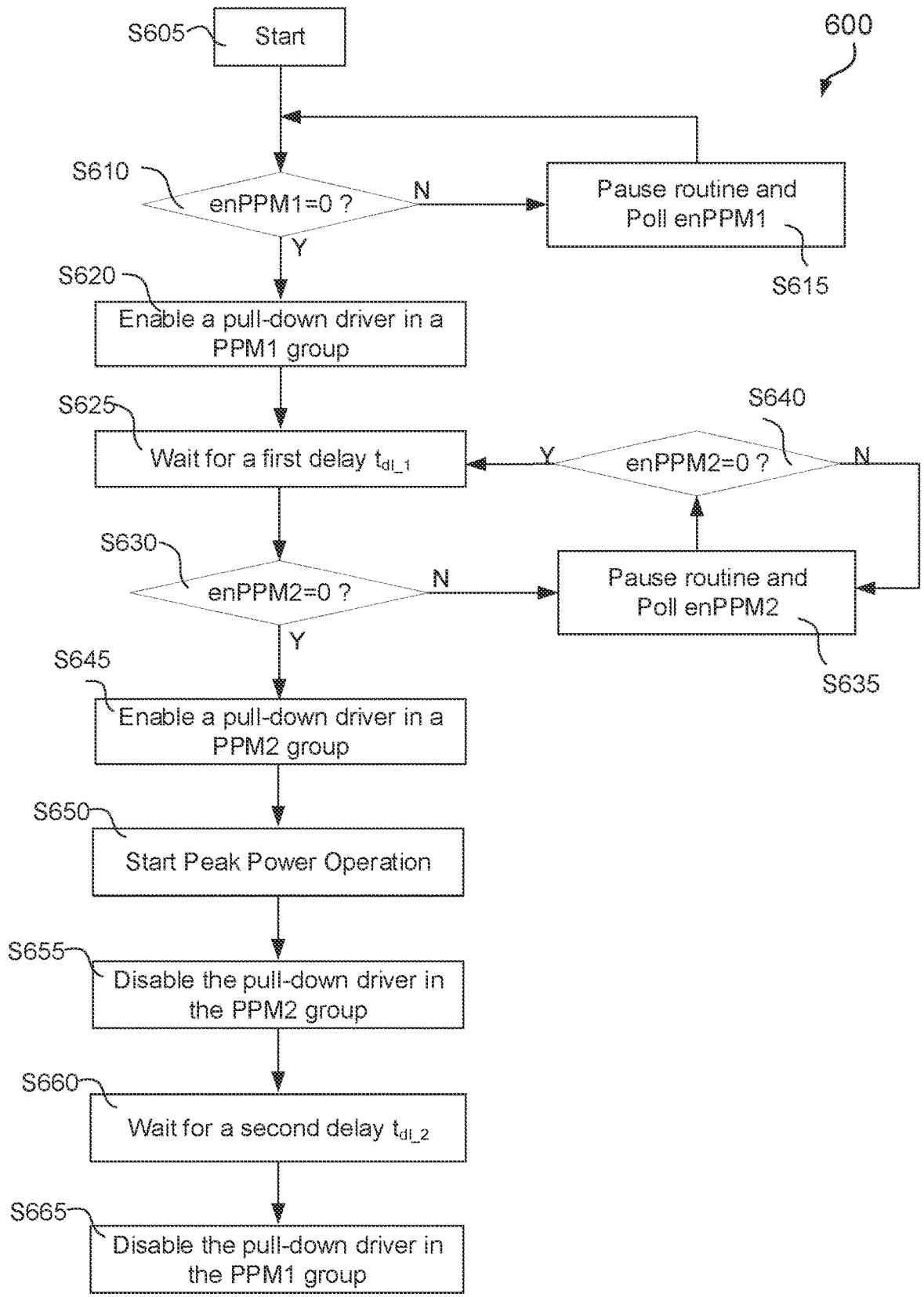
FIG. 6 illustrates a peak power check routine, according to some embodiments of the present disclosure.

FIG. 6 illustrates a peak power check routine 600 associated with the peak power management system 200 in FIG. 2 and the PPM circuit 300 in FIG. 3, according to some embodiments of the present disclosure. The PPM schemes shown in FIGS. 4 and 5 are used to determine the reference voltage $V_{ref}$ and generate the PPM enablement signal enPPM to indicate the maximum number of peak power operations allowed on a storage system. It should be understood that the peak power check (PPC) routine 600 are not exhaustive and that other operation steps can be performed as well before, after, or between any of the illustrated operation steps. In some embodiments, some operation steps of the PPC routine 600 can be omitted or other operation steps can be included, which are not described here for simplicity. In some embodiments, operation steps of the PPC routine 600 can be performed in a different order and/or vary.

The PPC routine 600 provides an exemplary method of managing peak power usage for a storage system with one or more memory dies, where each memory die includes at least one PPM circuit. The example below is shown for a storage system, e.g., in FIG. 2, where each memory die includes two PPM circuits, the PPM1 circuit 202 and the PPM2 circuit 206. Accordingly, the storage system includes two PPM groups, the PPM1 group 210 and the PPM2 group 211 for checking and regulating peak power operations performed by the memory dies. However, the method can be extended to a storage system where each memory die includes one or more PPM circuits.

The PPC routine 600 can be implemented before a memory die starts to perform a peak power operation such that the total power (or current) consumed by a storage system can be regulated and controlled to below a predetermined value.

The PPC routine 600 starts at operation step S605, when a storage system (e.g., the NAND storage system 10 in FIG. 1) determines that a memory die (e.g., the NAND flash memory 100-1 in FIG. 2) is ready to start a peak power operation. At the operation step S605, the PPM circuits (e.g., the first PPM circuit 202-1 and the second PPM circuit 206-1) on the NAND flash memory 100-1 are at a reset state. At the reset state, the pull-down drivers 336 in the PPM1 circuit 202-1 and the PPM2 circuit 206-1 are switched off. At the operation step S605, one of the pull-up drivers 314 in the PPM1 group 210 can be switched on if none of the pull-up drivers 314 in the PPM1 group 210 has been switched on. Similarly, one of the pull-up drivers 314 in the PPM2 group 211 can be switched on if none of the pull-up drivers 314 in the PPM2 group 211 has been switched on.

At operation step S610, the PPC routine 600 enters a first check point, where the PPM enablement signal enPPM1 of the PPM1 group is verified. If the PPM enablement signal enPPM1 is not zero (e.g., enPPM1=1), the PPC routine 600 pauses at operation step S615 and the PPM enablement signal enPPM1 is polled and verified again at operation step S610. As discussed previously, when the PPM enablement signal enPPM1=1, a maximum number of peak power operations have been reached, and the storage system cannot support any additional peak power operations or provide any additional operation using the peak current $I_{cc}$. Thus, when the PPM enablement signal enPPM1=1, the NAND flash memory 100-1 is prohibited to perform a peak power operation and must wait until the status of the enPPM1 is changed.

When the PPM enablement signal enPPM1 is zero, it is indicated that the storage system can support at least one additional peak power operation. The PPC routine 600 can then perform operation step S620.

At operation step S620, the pull-down driver 336-1 of the PPM1 circuit 202-1 on the NAND flash memory 100-1 can be switched on. If the resulting pull-down current $I_{pull\_dn-1}$ flowing through the pull-down driver 336-1 of the PPM1 circuit 202-1 can reduce the electric potential $V_{ppm}$ of the PPM1 group to equal or below the reference voltage $V_{ref}$, the PPM enablement signal enPPM1 is set to 1 (i.e., enPPM1=1). As a result, no more other memory dies requesting peak power operation and running the PPC routine 600 can pass the first check point at the operation step S610 after the PPM enablement signal enPPM1 is set to 1. If the resulting pull-down current $I_{pull\_dn-1}$ flowing through the pull-down driver 336-1 of the PPM1 circuit 202-1 does not lower the electric potential $V_{ppm}$ of the PPM1 group to a value equal or less than the reference voltage $V_{ref}$, the PPM enablement signal enPPM1 remains as zero (i.e., enPPM1=0). Other memory dies requesting peak power operation and running the PPC routine 600 can still pass the first check point at the operation step S610 until the PPM enablement signal enPPM1 is set to 1. As such one or more memory dies can run the PPC routine 600 simultaneously, and the peak power operations can be performed and coordinated more efficiently.

Next, at operation step S625, the PPC routine 600 is paused for a waiting period of a first delay period $t_{dl\_1}$, wherein the first delay period $t_{dl\_1}$ is different for each memory die. In the other words, the NAND flash memory 100-1 is assigned with the first delay period $t_{dl\_1}$ having a value different from any other NAND flash memories 100-2, 100-3, . . . 100-n in the same storage system. As such, when more than one memory die runs the PPC routine 600 simultaneously, each memory die waits for a different time period at the operation step S625. As discussed previously, the PPM pins of the same PPM group are electrically connected with each other and thus the memory dies in the same PPM group are controlled by the same electric potential $V_{ppm}$. When the PPM enablement signal enPPM1 is zero (i.e., enPPM1=0) at operation step S610, one or more memory dies of the same storage system that is running the PPC routine 600 can enable (or switch on) the pull-down driver 336 at the same time. By imposing a unique time delay for each memory die, memory dies can enter the subsequent operation step S630 one at a time. The memory dies completing the operation step S620 at the same time, can be desynchronized at the operation step S625. The operation step S625 can ensure that only one additional peak power operation can be allowed at any given time.

When the NAND flash memory 100-1 finishes the waiting period of the first delay period $t_{dl\_1}$, a second check point at operation step S630 can be resumed.

At operation step S630, the PPM enablement signal enPPM2 of the PPM2 group 211 is verified. If the PPM enablement signal enPPM2 is not zero (e.g., when enPPM2=1), the PPC routine 600 pauses at operation step S635 and the PPM enablement signal enPPM2 is polled and verified again at operation step S640. As discussed previously, when the PPM enablement signal enPPM2=1, a maximum number of peak power operations have been reached, and the storage system cannot support any additional peak power operation. Thus, when the PPM enablement signal enPPM2=1, the NAND flash memory 100-1 is prohibited to perform a peak power operation and must wait until the status of the enPPM2 is changed.

In some embodiments, the PPM enablement signal enPPM1 of the PPM1 group is zero at operation step S610, but the PPM enablement signal enPPM2 of the PPM2 group is not zero at operation step S630. In this example, additional peak power operation is started between the time period of the operation step S610 and operation step S630 by another memory die (e.g., NAND flash memory 100-2) in the storage system. For example, the NAND flash memory 100-2 completes operation step S625 before the NAND flash memory 100-1. By implementing operation steps S635 and S640, the memory die that has passed the first check point at operation step S610 can wait for its turn to perform a peak power operation.

When the PPM enablement signal enPPM2 is zero (i.e., enPPM2=0) at operation step S640, operation step S625 can be performed again to implement the first delay period $t_{dl\_1}$. And operation step S630 is performed again to verify if the PPM enablement signal enPPM2=0.

When the PPM enablement signal enPPM2=0 at operation step S630, the PPC routine 600 starts operation step S645, where the pull-down driver 336 of the PPM2 circuit 206-1 is switched on for the NAND flash memory 100-1.

At operation step S650, the NAND flash memory 100-1 starts to perform the peak power operation with the peak current $I_{cc}$. If the maximum number of peak power operations have been reached after the NAND flash memory 100-1 starts the peak power operation, the electric potential $V_{ppm}$ of the PPM2 group can be less than the reference voltage $V_{ref}$ and thereby the PPM enablement signal enPPM2 is set to 1 (i.e., enPPM2=1). If the maximum number of peak power operations have not been reached after the NAND flash memory 100-1 starts the peak power operation, the electric potential $V_{ppm}$ of the PPM2 group is still higher than the reference voltage $V_{ref}$. The PPM enablement signal enPPM2 remains as zero (i.e., enPPM2=0).

At operation step S655, after completing the peak power operation, the pull-down driver 336 of the PPM2 circuit 206-1 can be disabled (i.e., switched off) for the NAND flash memory 100-1. Accordingly, the PPM enablement signal enPPM2 for the PPM2 group can be reset to zero again.

At operation step S660, the PPC routine 600 performs a second delay period $t_{dl\_2}$, where the second delay period $t_{dl\_2}$ can be a predetermined time period, for example, 2 μs. The second delay period $t_{dl\_2}$ is chosen such that the memory dies, which have completed operation steps S610 and S620 and are waiting at the operation steps S635 and S640, can complete the peak power operation at operation step S650 before the PPC routine 600 allows other memory dies to pass through the first check point at the operation step S610. As such, memory dies that are delayed at the operation step S625 can be queued for peak power operations and complete operation steps S645-S655 one at a time, prior to any memory die that have not entered the first check point at operation step S610.

At operation step S665, the pull-down driver 336 of the PPM1 circuit 202-1 on the NAND flash memory 100-1 is disabled (i.e., switched off). Accordingly, the PPM enablement signal enPPM1 for the PPM1 group can be reset to zero again. Another batch of multiple memory dies can subsequently pass the first check point at operation step S610 and are queued for peak power operations.

Through an analog processing of the electric potential $V_{ppm}$ of the PPM pins connected between multiple memory dies, analog peak power management can be implemented. The PPM enablement signal enPPM can be used to encode with information regarding the number of peak power operations performed in a storage system. Multiple peak power operations below a maximum number can be performed simultaneously in a storage system with multiple memory dies. By using the PPC routine with two PPM groups, multiple memory dies can be queued and staggered for peak power operations once the power/current budget is available for the storage system.

Figure 7:
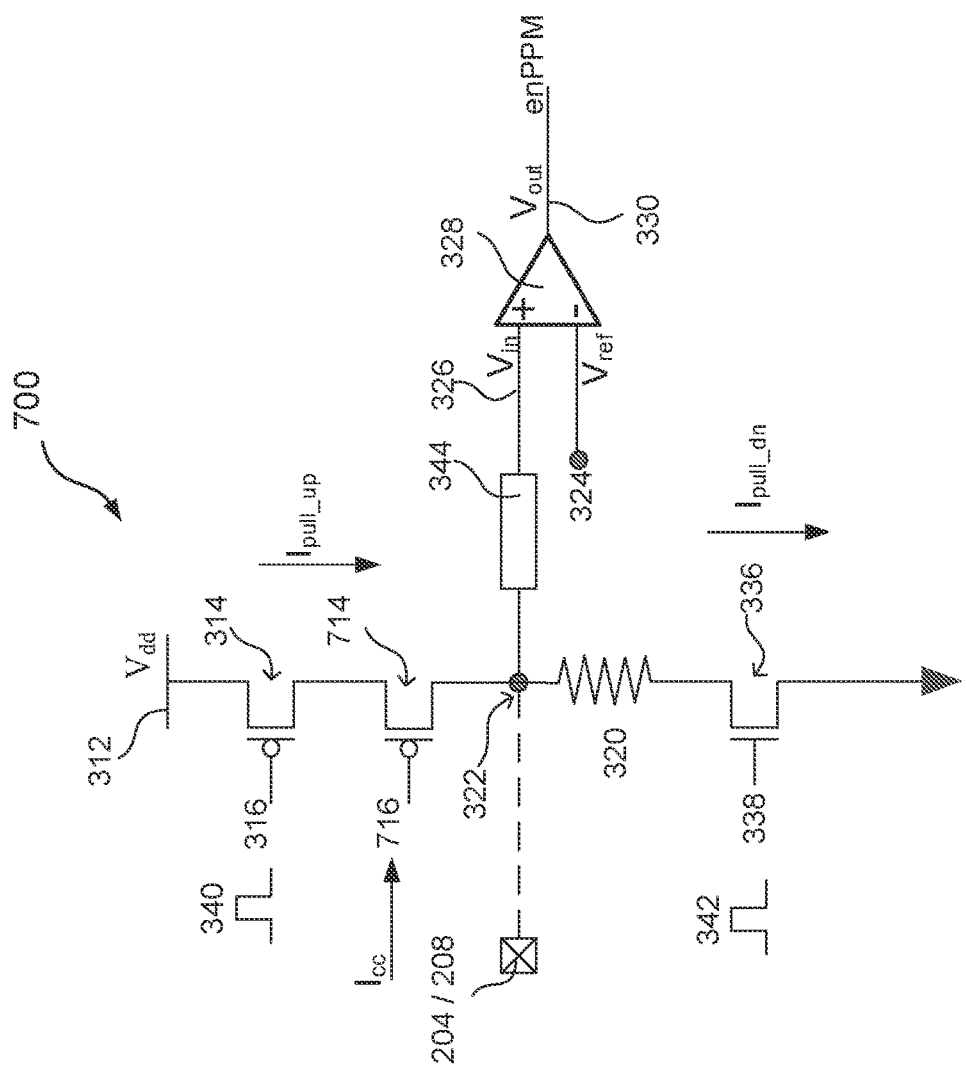
FIG. 7 illustrates a peak power management circuit, according to some embodiments of the present disclosure.

FIG. 7 illustrates an exemplary PPM circuit 700, according to some embodiments of the present disclosure, where each of the PPM1 circuits 202 and each of the PPM2 circuits 206 shown in FIG. 2 can be similar to the PPM circuit 700. The PPM circuit 700 is similar to the PPM circuit 300 shown in FIG. 3, except that the pull-up resistor 318 in FIG. 3 can be replaced by a pull-up current source 714 and that the inverter 332 of the output circuit in FIG. 3 can be removed. The pull-up current source 714 can be any current source that provide constant current. In some embodiments, the pull-up current source 714 can be a transistor, for example, a field-effect transistor (FET). In FIG. 7, a p-channel MOSFET is shown as an example. However, the pull-up current source 714 is not so limiting. For example, the pull-up current source 714 can be a bipolar transistor, an n-channel MOSFET, etc. The functionality of the other components of the PPM circuit 700 is similar to the PPM circuit 300 described with respect to FIG. 3, and only the differences will be discussed below.

In this example, the magnitude of the pull-up current $I_{pull\_up}$ flowing through the pull-up current source 714 can be controlled through the pull-up current source 714. In one example, the pull-up current $I_{pull\_up}$ can be determined by a voltage level at a gate terminal 716 and the trans-conductance of the pull-up current source 714. In this example, the pull-up current $I_{pull\_up}$ can signal the peak power operation performed on the memory die. For example, the pull-up current $I_{pull\_up}$ can be proportional to the peak current $I_{cc}$. The pull-up current $I_{pull\_up}$ can be scaled down from the peak current $I_{cc}$. Therefore, the peak power operations can be regulated for each memory die through the pull-up current $I_{pull\_up}$. Similar to the PPM circuit 300 in FIG. 3, through the die-to-die connections at the PPM contact pads, peak power operations throughout the entire storage system can be coordinated between different memory dies using the PPM circuit 700.

In this example, one pull-down driver 336 can be switched on (i.e., enabled) within each PPM group (e.g., within the PPM1 group 210 or the PPM2 group 211 in FIG. 2) during operation and the other pull-down drivers 336 in the same PPM group can be switched off. As such, in each PPM group, current only flows from the pull-down resistor 320 through the pull-down driver 336, which is switched on, to the ground. In this example, in response to the PPM circuit selecting signal received at the communication interface, the control circuits 70 of the memory die can send the second control signal 342 to switch on or off the pull-down driver 336 of the PPM1 circuit 202 and/or the PPM2 circuit 206 on the memory die. For example, if a particular memory die is selected according to the PPM circuit selecting signal, the control circuits 70 of the particular memory die can send the second control signal 342 having a voltage higher than a threshold voltage of the pull-down driver 336 to switch on the pull-down driver 336. Otherwise, if a memory die does not receive the PPM circuit selecting signal at the communication interface, the control circuits 70 of the memory die can send the second control signal 342 having a voltage lower than a threshold voltage of the pull-down driver 336 to switch off the pull-down driver 336. During operation, the pull-up driver 314 can be switched on or off depending on the status of the memory die, and can be independently controlled according to the PPM management scheme discussed below. For example, when the NAND flash memory 100-1 (in FIG. 2) performs a peak power operation using the peak current $I_{cc}$, the pull-up driver 314 of the PPM1 circuit 202-1 can be switched on. A conductive path can be formed from the power source 312 through the pull-up driver 314 to the pull-up current source 714, where the pull-up current $I_{pull-up}$ can be a current mirror of the peak current $I_{cc}$. The NAND flash memories 100-1 is prohibited from performing any peak power operation when enPPM=1; correspondingly, the pull-up driver 314 of the PPM1 circuit 202-1 is switched off, where no current can flow through the pull-up driver 314 on the NAND flash memory 100-1.

The electric potential $V_{ppm}$ of the node 322 (or the PPM pins) depends on the number of pull-up drivers 314 that are switched on in each PPM group. Because a peak power operation can be performed on a memory die when the pull-up driver 314 is switched on, by monitoring the electric potential $V_{ppm}$, the number of peak power operations performed in a storage system having multiple memory dies can thereby be regulated.

Figure 8:
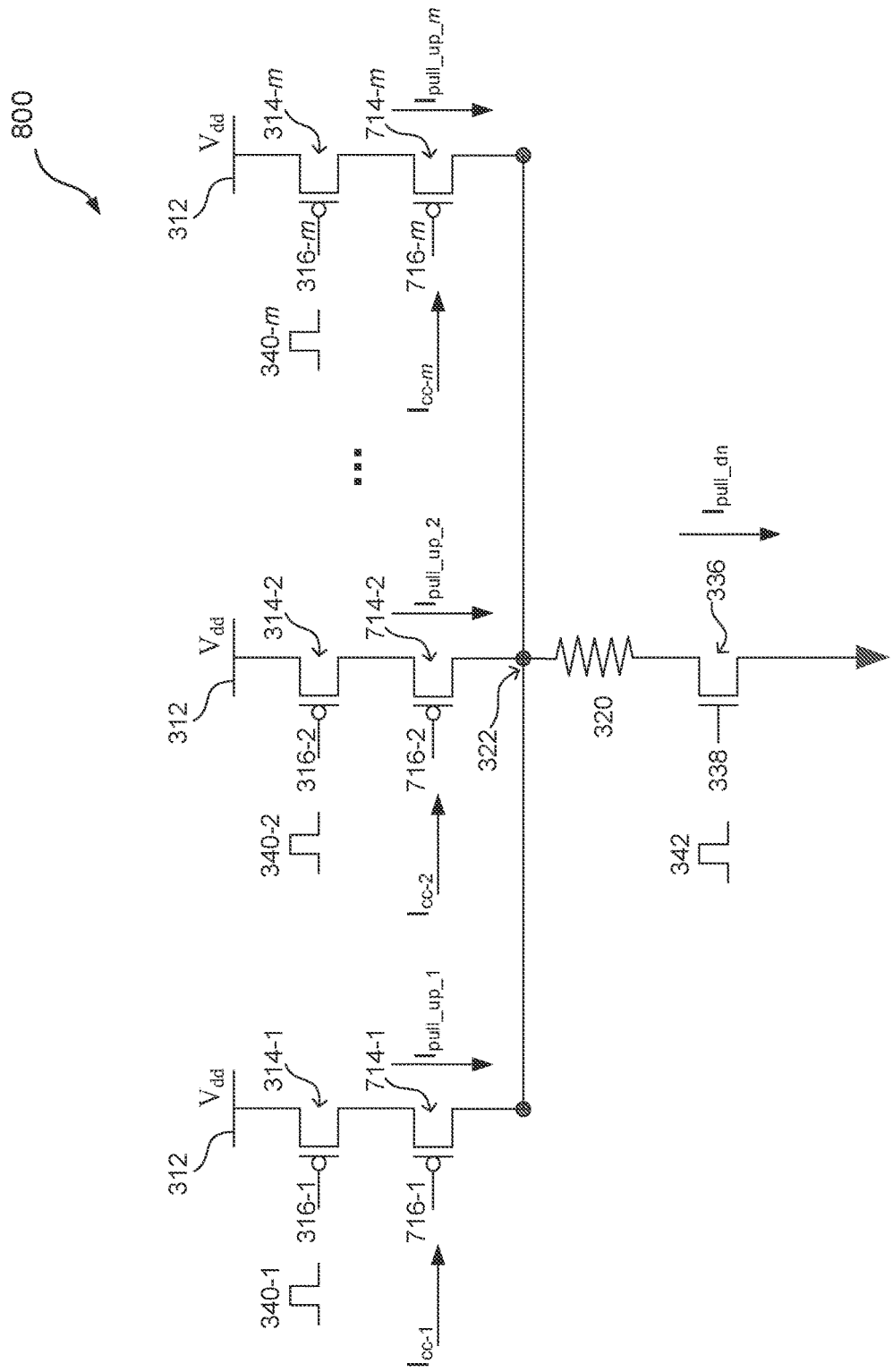
FIG. 8 illustrates an equivalent circuit of a peak power management group, according to some embodiments of the present disclosure.

FIG. 8 shows an equivalent circuit 800 of a PPM group using PPM circuit 700 shown in FIG. 7, according to some embodiments of the present disclosure. In operation, since only the pull-up drivers 314 and the pull-down driver 336 that are switched on can form conductive paths, FIG. 8 omits those pull-up drivers 314 and pull-down drivers 336 that are switched off. As discussed previously, the node 322 is electrically connected to the PPM pin on the memory die, and all the PPM pins in the same PPM group are electrically connected between different memory dies. The node 322 can be held at the same electrical potential $V_{ppm}$ in the entire PPM group between different memory dies, and is illustrated as one intersection point to the pull-down resistor 320 in FIG. 8.

While only one pull-down driver 336 is switched on in one PPM group for peak power management, the pull-up drivers 314 (e.g., 314-1, 314-2, ..., 314-m) can be switched on according to the memory die performing the peak power operation, i.e., using the peak current $I_{cc}$. Assuming that one memory die can perform one peak power operation, then m number of memory dies (e.g., NAND flash memory 100-1, 100-2, ..., 100-m in FIG. 2) can perform m number of peak power operations simultaneously in the storage system 10. In the configuration in FIG. 8, the pull-up driver 314 is connected in series with the pull-up current source 714 on one memory die. In the same PPM group, the pull-up drivers 314 (e.g., 314-1, 314-2, ..., 314-m) are connected in parallel, and the pull-up current sources 714 (e.g., 714-1, 714-2, ..., 714-m) are connected in parallel. In this configuration, the pull-down current $I_{pull\_dn}$ flowing through the pull-down driver 336 is the sum of the pull-up currents $I_{pull\_up}$ (e.g., $I_{pull\_up-1}$, $I_{pull\_up-2}$, ..., $I_{pull\_up-m}$) flowing through each of the pull-up current sources 714 and the pull-up drivers 314 that are switched on. The equivalent circuit 800 functions as a voltage divider, and the electric potential $V_{ppm}$ of the node 322 can be expressed as a function of m, the number of peak power operation, i.e., the number of memory dies performing peak power operations if one memory die performs one peak power operation:

$$V_{ppm}(m)=m*i*R_d \quad (4)$$

where $R_d$ is the resistances of the pull-down resistor 320, and i is the magnitude of the pull-up current $I_{pull\_up}$, which can be controlled through the pull-up current source 714 (e.g., 714-1, 714-2, ..., 714-m). In some embodiments, the magnitude i of the pull-up current $I_{pull\_up}$ (e.g., $I_{pull\_up-1}$, $I_{pull\_up-2}$, ..., $I_{pull\_up-m}$) can be different on different memory dies and a person of skill in the art can modify the Equation (4) accordingly. As shown in Equation (4), by using the pull-up current source 714 in FIG. 7 instead of the pull-up resistor 318 in FIG. 3, the electrical potential $V_{ppm}$ at the node 322 (or at the first and second PPM contact pads 204/208) can be proportional to the number m of the peak power operations. In this example, the electrical potential $V_{ppm}$ can have a liner relationship with the number m of the peak power operations by using the pull-up current source 714. In this example, the electric potential $V_{ppm}$ increases when m, the number of peak power operations, increases. As the number of peak power operations (i.e., the variable m) changes continuously, the electric potential $V_{ppm}$ changes continuously accordingly. Similar to embodiment shown in FIG. 3, through an analog circuit like the PPM circuit 700, information about the peak power operations in each PPM group can be encoded into the electric potential $V_{ppm}$ of the PPM pins in an analog way in embodiment shown in FIG. 7.

FIG. 9 illustrates an exemplary peak power management scheme using the PPM circuit 700 and its equivalent circuit 800, according to some embodiments of the present disclosure. In this example, the resistance $R_d$ of the pull-down resistor 320 is assumed to be 1000 ohm and the magnitude i of the pull-up current $I_{pull-up}$ is assumed to be 160 µA. It is noted that these assumptions are chosen to provide an illustration of the principles of the peak power management scheme in the present disclosure. A person of ordinary skill in the art can utilize the principle of the peak power management scheme described here with various modifications as suitable for the practical applications. All such modifications and variations are within the scope of the present disclosure.

Referring to FIGS. 8 and 9, to start peak power management, any one of the pull-down driver 336 in the respective PPM group can be switched on. If there is no memory die performing peak power operation, none of the pull-up drivers 314 is switched on in the PPM group. The electric potential $V_{ppm}$ of the node 322 is connected to the ground through the conductive path established by the pull-down resistor 320 and the specific pull-down driver 336 that is switched on. As such, $V_{ppm}(0)=0$ V (at m=0).

When one of the memory dies, e.g., the NAND flash memory 100-1 (in FIG. 2), is performing the peak power operation, the memory die consumes the peak current $I_{cc-1}$. The first control signal 340-1 can be generated to switch on the pull-up driver 314-1 of the PPM circuit on the NAND flash memory 100-1 to signal the peak power operation on the NAND flash memory 100-1. The pull-up current $I_{pull\_up-1}$ can flow from the power source 312 through the pull-up driver 314-1, the pull-up current source 714-1, the pull-down resistor 320 and the pull-down driver 336 to the ground. The electric potential $V_{ppm}$ at the node 322 is changed to $V_{ppm}(1)=i*R_d=0.16$ V (at m=1).

When another memory die, e.g., the NAND flash memory 100-2 (in FIG. 2), is also performing the peak power operation, the first control signal 340-2 can be generated to switch on the pull-up driver 314-2 to signal the peak power operation on the NAND flash memory 100-2. As such, the pull-up current $I_{pull\_up-2}$ can flow through the pull-up driver 314-2 and the pull-up current source 714-2. The pull-up current $I_{pull\_up-1}$ and the pull-up current $I_{pull\_up-2}$ flow through the pull-down resistor 320 and the pull-down driver 336 as the pull-down current $I_{pull\_dn}$. The electric potential $V_{ppm}$ at the node 322 is then changed to $V_{ppm}(2)=2*i*R_d=0.32$ V (at m=2).

Similarly, when a third memory die, e.g., the NAND flash memory 100-3 (in FIG. 2), is also performing the peak power operation, the electric potential $V_{ppm}$ at the node 322 is then changed to $V_{ppm}(3)=3*i*R_d=0.48$ V (at m=3). Using the Equation (4), the electric potential $V_{ppm}$ can be calculated if four memory dies (m=4) in the storage system 10 are using the peak current $I_{cc}$, i.e. performing the peak power operations. The electric potential $V_{ppm}(4)=4*i*R_d=0.64$ V. The electric potentials $V_{ppm}$ (m) are listed in FIG. 9 for various number of peak power operations (i.e., 0, 1, 2, 3, 4, ..., m−1, m), where m is a positive integer.

As such, the electric potential $V_{ppm}$ of the node 322 or the PPM contact pads depends on the number m of peak power operations. According to Equation (4) and FIG. 9, the electric potential $V_{ppm}$ increases when the number m of the peak power operations increases. Therefore, the reference voltage $V_{ref}$ for the comparator 328 (in FIG. 7) can be chosen such that the PPM enablement signal enPPM at the output terminal 330 of the comparator 328 can be set at, for example, logic zero (enPPM=0) when the electric potential $V_{ppm}$ is lower than the reference voltage $V_{ref}$, i.e., when the number of memory dies performing peak power operations is less than a predetermined number. And the PPM enablement signal enPPM can be set at enPPM=1 when the electric potential $V_{ppm}$ is not lower than the reference voltage $V_{ref}$, i.e., when the number of memory dies performing peak power operations has reached (equal or greater than) the predetermined number.

Similar to the embodiment shown in FIG. 3, the reference voltage $V_{ref}(m)$, corresponding to the maximum number m of peak power operations, can be set to a voltage in a range between the electric potential $V_{ppm}$ (m) and the electric potential $V_{ppm}$ (m−1):

$$(m-1)*i*R_d < V_{ref}(m) < m*i*R_d \quad (5)$$

In the example shown in FIG. 9, if the maximum number of peak power operations allowed is 2, the reference voltage $V_{ref}$ can be a voltage in a range between $V_{ppm}(2)$=0.32V and $V_{ppm}(1)$=0.16 V, where $V_{ref}(2)$=0.24 V can be chosen in FIG. 9 as an example. If the electric potential $V_{ppm}$ is less than the reference voltage $V_{ref}$=0.24 V, the PPM enablement signal enPPM=0 is generated at the output terminal 330 (see FIG. 7), indicating that the number of peak power operations is 0 or 1, less than the maximum number of 2. The storage system can have at least one additional peak power operation performed by at least one of the memory dies. When there are two peak power operations performed simultaneously, e.g., two memory dies are consuming the peak current $I_{cc}$, the electric potential $V_{ppm}$=0.32 V, higher than the reference voltage $V_{ref}$=0.24 V. The PPM enablement signal enPPM=1 can be generated accordingly, indicating that the maximum number of peak power operations of 2 has been reached. The NAND storage system can then prohibit additional memory die to perform a peak power operation. As such, the PPM enablement signal enPPM can function as an indicator for the number of peak power operations performed in the storage system with multiple memory dies. Through analog PPM circuit 700 and voltages (e.g., analog voltages) associated with the electric potential $V_{ppm}$, the reference voltage $V_{ref}$, gate voltage applied to the pull-up current source 714, etc., multiple peak power operations can be controlled simultaneously.

Figure 10:
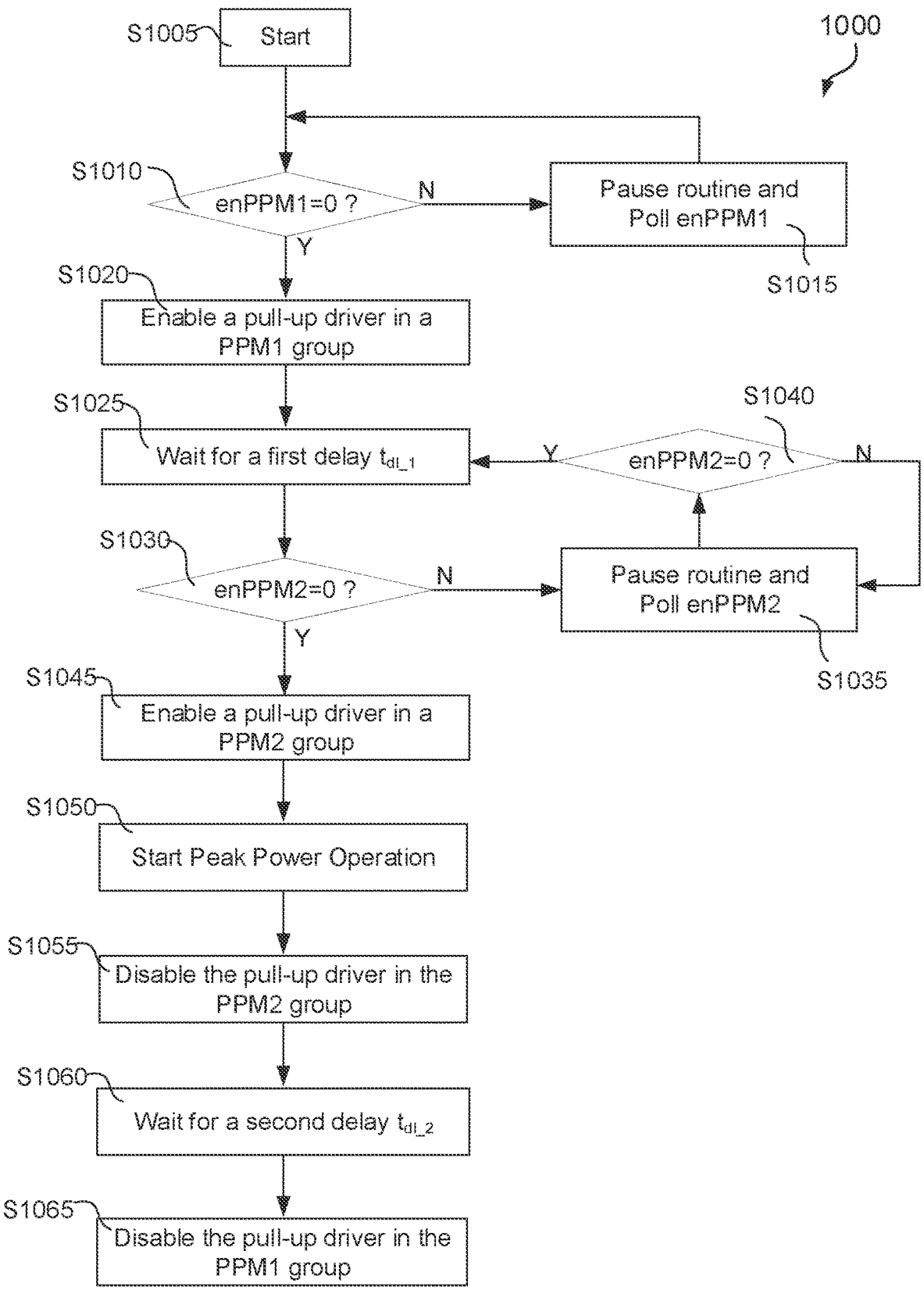
FIG. 10 illustrates a peak power check routine, according to some embodiments of the present disclosure.

FIG. 10 illustrates a peak power check routine 1000 associated with the peak power management system 200 in FIG. 2 and the PPM circuit 700 in FIG. 7, according to some embodiments of the present disclosure. The PPM schemes shown in FIGS. 8 and 9 are used to determine the reference voltage $V_{ref}$ and generate the PPM enablement signal enPPM to indicate the maximum number of peak power operations allowed on a storage system. It should be understood that the peak power check (PPC) routine 1000 are not exhaustive and that other operation steps can be performed as well before, after, or between any of the illustrated operation steps. In some embodiments, some operation steps of the PPC routine 1000 can be omitted or other operation steps can be included, which are not described here for simplicity. In some embodiments, operation steps of the PPC routine 1000 can be performed in a different order and/or vary.

The PPC routine 1000 is similar to the PPC routine 600 shown in FIG. 6, except that the PPM circuit 300 in FIG. 3 is replaced by PPM circuit 700 in FIG. 7. While the electric potential $V_{ppm}$ decreases with the number m of peak power operations using PPM circuit 300 (see Equation (2) and FIG. 5), the electric potential $V_{ppm}$ proportionally increases with the number m of peak power operations using PPM circuit 700 (see Equation (4) and FIG. 9). Additionally, by using the pull-up current source 714 instead of the pull-up resistor 318, the electric potential $V_{ppm}$ is in linear relationship with the number m of peak power operations (see Equation (4)). The description below for the PPC routine 1000 will be focused on the difference from the PPC routine 600. Similar operations will be omitted for simplicity.

At the operation step S1005, the PPM circuits 700 of the PPM1 group 210 and the PPM2 group 211 (in FIG. 2) can be reset first. At the reset state, the pull-up drivers 314 are all switched off. One of the pull-down drivers 336 in the PPM1 group 210 can be switched on. Similarly, one of the pull-down drivers 336 in the PPM2 group 211 can be switched on.

At operation step S1010, the PPC routine 1000 enters a first check point, where the PPM enablement signal enPPM1 of the PPM1 group is verified. Similar to the operation step S610 in FIG. 6, if the PPM enablement signal enPPM1 is not zero (e.g., enPPM1=1), the PPC routine 1000 will be paused because a maximum number of peak power operations have been reached, and the storage system cannot support any additional peak power operations or provide any additional operation using the peak current $I_{cc}$. The PPM enablement signal enPPM1 is polled at operation step S1015, and verified again at operation step S1010. As such, when the PPM enablement signal enPPM1=1, the NAND flash memory 100-1 (in FIG. 2) is prohibited to perform a peak power operation and must wait until the status of the enPPM1 is changed.

When the PPM enablement signal enPPM1 is zero, it is indicated that the storage system can support at least one additional peak power operation. The PPC routine 1000 moves to the operation step S1020.

At operation step S1020, the pull-up driver 314-1 of the PPM1 circuit 202-1 on the NAND flash memory 100-1 can be switched on. If the resulting pull-up current $I_{pull\_up-1}$ that flows through the pull-up driver 314-1 and the pull-up current source 714-1 of the PPM1 circuit 202-1 increases the electric potential $V_{ppm}$ of the PPM1 group to equal or above the reference voltage $V_{ref}$, the PPM enablement signal enPPM1 will be set to 1 (i.e., enPPM1=1). As a result, no more other memory dies requesting peak power operation and running the PPC routine 1000 can pass the first check point at the operation step S1010 after the PPM enablement signal enPPM1 is set to 1. If the resulting pull-up current $I_{pull\_up-1}$ does not increase the electric potential $V_{ppm}$ of the PPM1 group to equal or above the reference voltage $V_{ref}$, the PPM enablement signal enPPM1 remains as zero (i.e., enPPM1=0). Other memory dies requesting peak power operation and running the PPC routine 1000 can still pass the first check point at the operation step S1010 until the PPM enablement signal enPPM1 is set to 1. As such one or more memory dies can run the PPC routine 1000 simultaneously, and the peak power operations can be performed and coordinated more efficiently.

Similar to the operation step S625 of the PPC routine 600 (FIG. 6), the PPC routine 1000 (FIG. 10) pauses at the operation step S1025 for the waiting period of the first delay period $t_{dl\_1}$, wherein the first delay period $t_{dl\_1}$ is different for each memory die. By imposing a unique time delay for each memory die, memory dies can enter the subsequent operation step S1030 one at a time. The memory dies completing the operation step S1020 at the same time, can be desynchronized at the operation step S1025. Similar to the operation step S625, the operation step S1025 ensures that only one additional peak power operation can be allowed at any given time.

The implementation of operation steps S1030, S1035 and S1040 are similar to operation steps S630, S635 and S640 in FIG. 6. When the PPM enablement signal enPPM2=0 at operation step S1030, the PPC routine 1000 moves to operation step S1045, where the pull-up driver 314 of the PPM2 circuit 206-1 can be switched on for the NAND flash memory 100-1.

At operation step S1050, the NAND flash memory 100-1 starts to perform the peak power operation with the peak current $I_{cc}$. If the maximum number of peak power operations have been reached after the NAND flash memory 100-1 starts the peak power operation, the electric potential $V_{ppm}$ of the PPM2 group can be increased to equal or above the reference voltage $V_{ref}$ and thereby the PPM enablement signal enPPM2 will be set to 1 (i.e., enPPM2=1). If the maximum number of peak power operations have not been reached after the NAND flash memory 100-1 starts the peak power operation, the electric potential $V_{ppm}$ of the PPM2 group is still lower than the reference voltage $V_{ref}$. The PPM enablement signal enPPM2 remains as zero (i.e., enPPM2=0).

At operation step S1055, after completing the peak power operation, the pull-up driver 314 of the PPM2 circuit 206-1 can be disabled (i.e., switched off) for the NAND flash memory 100-1. Accordingly, the PPM enablement signal enPPM2 for the PPM2 group can be reset to zero again.

At operation step S1060, the PPC routine 1000 performs the second delay period $t_{dl\_2}$, similar to the operation step S660 in FIG. 6.

At operation step S1065, the pull-up driver 314 of the PPM1 circuit 202-1 on the NAND flash memory 100-1 is disabled (i.e., switched off). Accordingly, the PPM enablement signal enPPM1 for the PPM1 group can be reset to zero again. Another batch of multiple memory dies can subsequently pass the first check point at operation step S1010 and are queued for peak power operations.

Figure 11:
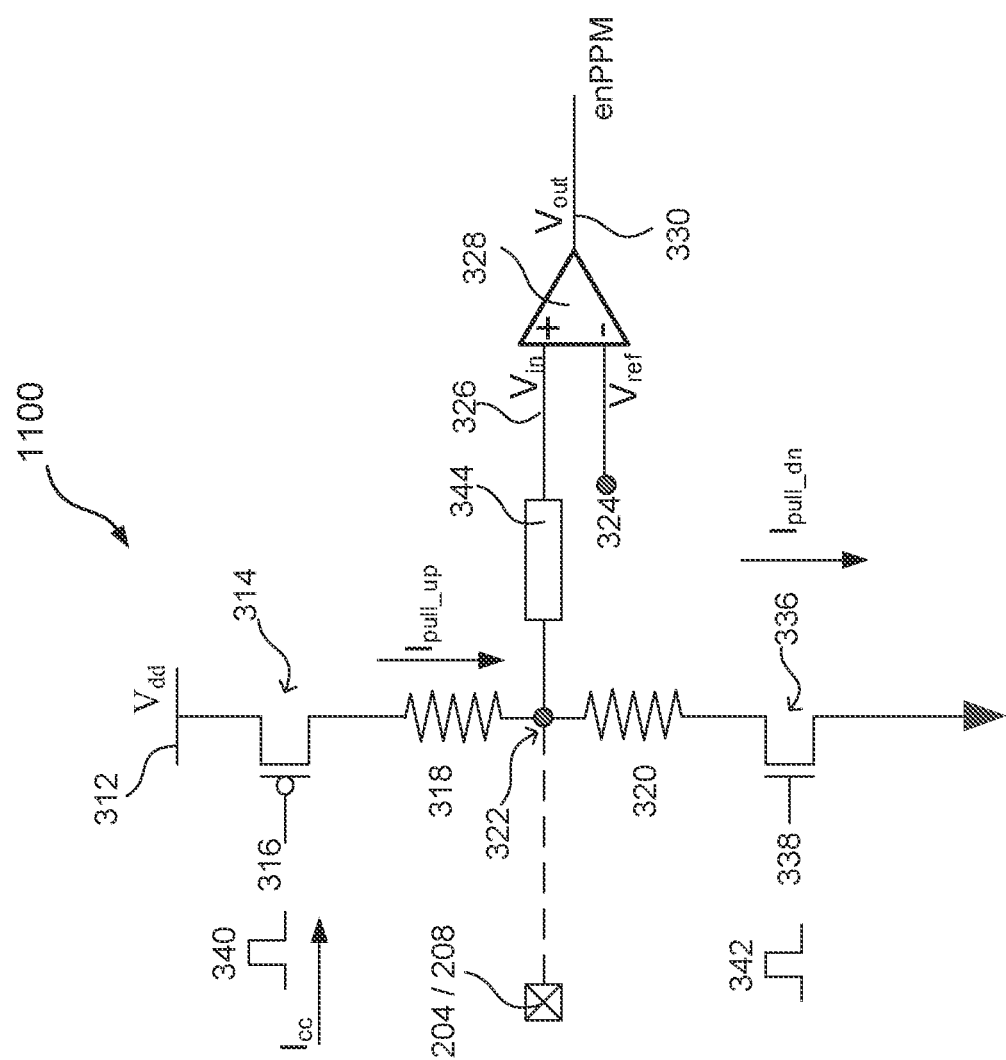
FIG. 11 illustrates a peak power management circuit, according to some embodiments of the present disclosure.

FIG. 11 illustrates an exemplary PPM circuit 1100 on the NAND flash memory 100, according to some embodiments of the present disclosure, where each of the PPM1 circuits 202 and each of the PPM2 circuits 206 shown in FIG. 2 can be similar to the PPM circuit 1100. Structurally, the PPM circuit 1100 is similar to the PPM circuit 300 in FIG. 3 except that 1) the pull-up current $I_{pull-up}$ controlled by the pull-up driver 314 is used to signal the peak power operation performed on the memory die instead of the pull-down current $I_{pull-dn}$ in FIGS. 3 and 2) the inverter 332 of the output circuit in FIG. 3 can be removed. In this example, the pull-up driver 314 can be switched on or off to control the pull-up current $I_{pull-up}$ flowing through the pull-up driver 314 and the pull-up resistor 318. The peak current $I_{cc}$ of a memory die (e.g., the NAND flash memory 100-1) used during the peak power operation can correspond to the voltage level of the first control signal 340, which can switch on the pull-up driver 314.

The operation (i.e., switching on/off pull-up and pull-down drivers 314/366) of the PPM circuit 1100 is similar to the PPM circuit 700 in FIG. 7 where the difference lies in the relationship between the electric potential $V_{ppm}$ and the number m of peak power operations. In this example, one pull-down driver 336 can be selected to be switched on (i.e., enabled) within each PPM group (e.g., within the PPM1 group 210 or the PPM2 group 211 in FIG. 2) during operation and the other pull-down drivers 336 in the same PPM group can be switched off. As such, in each PPM group, current only flows from the pull-down resistor 320 through the pull-down driver 336, which is switched on, to the ground. During operation, the pull-up driver 314 can be switched on or off depending on the status of the memory die, and can be independently controlled according to the PPM management scheme, similar to that of the PPM circuit 700 described with respect to FIGS. 7-10, where the differences will be discussed below.

Figure 12:
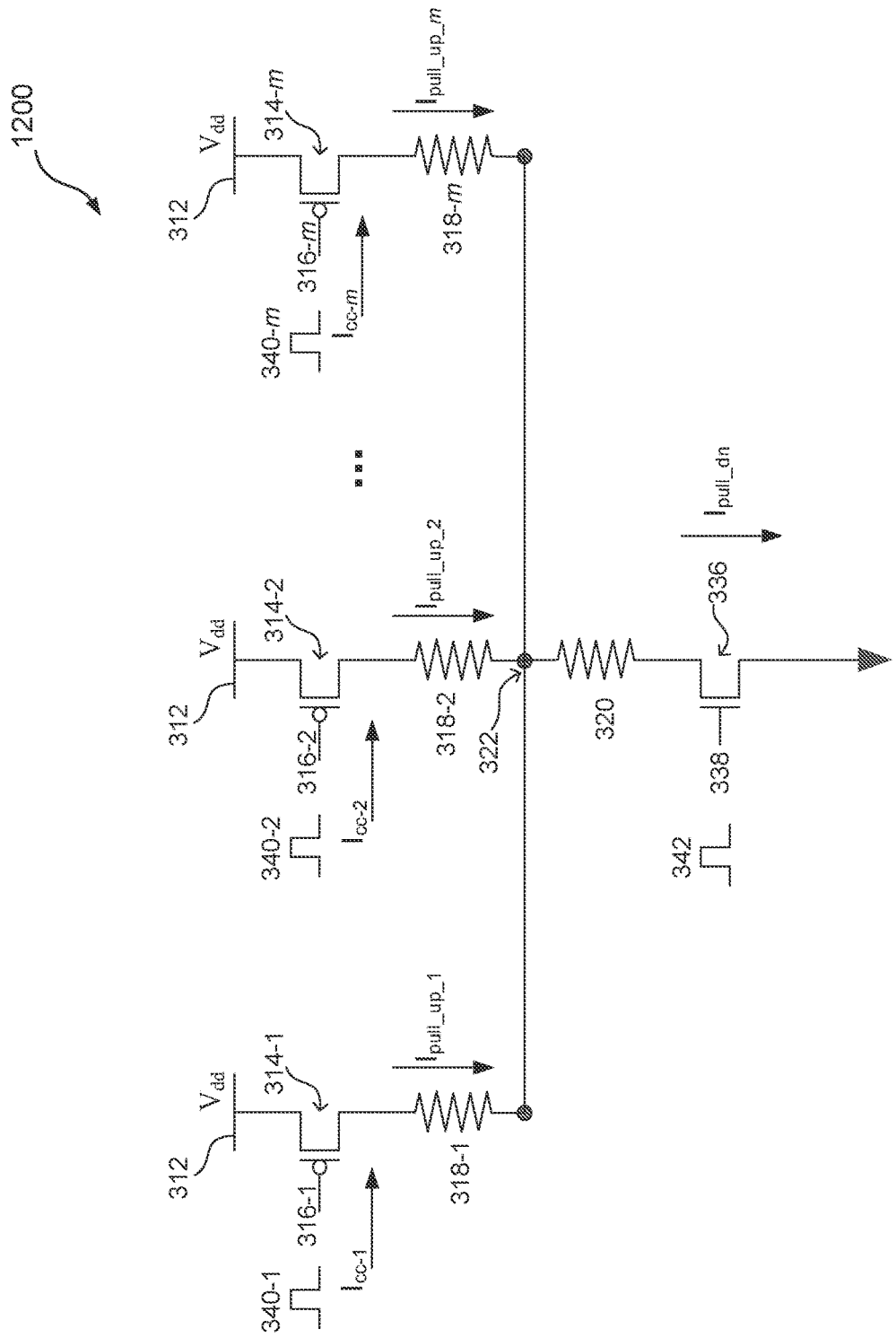
FIG. 12 illustrates an equivalent circuit of a peak power management group, according to some embodiments of the present disclosure.

FIG. 12 shows an equivalent circuit 1200 of a PPM group using the PPM circuits 1100 shown in FIG. 11, according to some embodiments of the present disclosure. Similar to the equivalent circuit shown in FIG. 8, only one pull-down driver 336 is switched on in one PPM group for peak power management, and the pull-up drivers 314 (e.g., 314-1, 314-2, . . . , 314-m) can be switched on according to the memory die performing the peak power operation, i.e., using the peak current $I_{cc}$. The difference between FIG. 8 and FIG. 12 is that the pull-up current sources 714 is used in FIG. 8 and the pull-up resistors 318 (e.g., 318-1, 318-2, . . . , 318-m) is used in FIG. 12. The electric potential $V_{ppm}$ of the node 322 can be expressed as a function of m, the number of peak power operations, i.e., the number of memory dies performing peak power operations if one memory die performs one peak power operation:

$$V_{ppm}(m) = \frac{mR_d}{mR_d + R_u} V_{dd} \qquad (6)$$

where $R_d$ and $R_u$ are the resistances of the pull-down resistor 320 and the pull-up resistor 318, respectively. In some embodiments, the magnitude of the pull-up current $I_{pull-up}$ (e.g., $I_{pull\_up-1}$, $I_{pull\_up-2}$, . . . , $I_{pull\_up-m}$) can be different on different memory dies and a person of skill in the art can modify the Equation (6) accordingly. As shown in Equation (6), the electrical potential $V_{ppm}$ at the node 322 (or at the first and second PPM contact pads 204/208) increases when the number m of the peak power operations increases. As the number of peak power operations (i.e., the variable m) changes continuously, the electric potential $V_{ppm}$ changes continuously accordingly. As such, through an analog circuit like the PPM circuit 1100, information about the peak power operations in each PPM group can be encoded into the electric potential $V_{ppm}$ of the PPM pins in an analog way.

FIG. 13 illustrates an exemplary peak power management scheme using the PPM circuit 1100 (FIG. 11, see also equivalent circuit 1200 in FIG. 12), according to some embodiments of the present disclosure. In this example, it is assumed that the resistance $R_u$ is twice as much as the resistance $R_d$ and the voltage $V_{dd}$ of the power source 312 is 1.2V.

Referring to FIGS. 12 and 13, to start peak power management, any one of the pull-down driver 336 in the PPM group can be switched on. If there is no memory die performing peak power operation, none of the pull-up drivers 314 is switched on. The electric potential $V_{ppm}$ of the node 322 is connected to the ground through the conductive path established by the pull-down resistor 320 and the specific pull-down driver 336 that is switched on. As such, $V_{ppm}(0)=0$ V(at m=0).

When one of the memory dies, e.g., the NAND flash memory 100-1, is performing the peak power operation, the memory die consumes the peak current $I_{cc-1}$. The first control signal 340-1 can be generated to switch on the pull-up driver 314-1 of the PPM circuit on the NAND flash memory 100-1 to signal the peak power operation on the NAND flash memory 100-1. The pull-up current $I_{pull\_up-1}$ can flow from the power source 312 through the pull-up driver 314-1, the pull-up resistor 318-1, the pull-down resistor 320 and the pull-down driver 336 to the ground. The electric potential $V_{ppm}$ at the node 322 is changed to $$V_{ppm}(1) = \frac{R_d}{R_d + R_u} V_{dd} = 0.4 \text{ V (at } m = 1).$$

When another memory die, e.g., the NAND flash memory 100-2, is also performing the peak power operation, the first control signal 340-2 can be generated to switch on the pull-up driver 314-2 to signal the peak power operation on the NAND flash memory 100-2. As such, the pull-up current $I_{pull\_up-2}$ can flow through the pull-up driver 314-2 and the pull-up resistor 318-2. The pull-up current $I_{pull\_dn-1}$ and the pull-down current $I_{pull\_dn-2}$ flow through the pull-down resistor 320 and the pull-down driver 336 as the pull-down current $I_{pull\_dn}$. The electric potential $V_{ppm}$ at the node 322 is then changed to $$V_{ppm}(2) = \frac{2R_d}{2R_d + R_u} V_{dd} = 0.6 \text{ V (at } m = 2).$$

Similarly, when a third memory die, e.g., the NAND flash memory 100-3, is also performing the peak power operation, the electric potential $V_{ppm}$ at the node 322 is then changed to $$V_{ppm}(3) = \frac{3R_d}{3R_d + R_u} V_{dd} = 0.72 \text{ V (at } m = 3).$$

Using the Equation (6), the electric potential $V_{ppm}$ can be calculated if four memory dies (m=4) in the storage system 10 are using the peak current $I_{cc}$, i.e. performing the peak power operations. The electric potential $$V_{ppm}(4) = \frac{4R_d}{4R_d + R_u} V_{dd} = 0.8 \text{ V}.$$

The electric potentials $V_{ppm}(m)$ are listed in FIG. 13 for various number of peak power operations (i.e., 0, 1, 2, 3, 4, . . . , m−1, m), where m is a positive integer.

As shown in FIG. 13, the electric potential $V_{ppm}$ increases when the number of the peak power operations increases. Therefore, the reference voltage $V_{ref}$ for the comparator 328 (in FIG. 11) can be chosen such that the PPM enablement signal enPPM at the output terminal 330 of the comparator 328 can be set at, for example, logic zero (enPPM=0) when the electric potential $V_{ppm}$ is lower than the reference voltage $V_{ref}$, i.e., when the number of memory dies performing peak power operations is less than a predetermined number. And the PPM enablement signal enPPM can be set at enPPM=1 when the electric potential $V_{ppm}$ is not lower than the reference voltage $V_{ref}$, i.e., when the number of memory dies performing peak power operations has reached (equal or greater than) the predetermined number.

Similar to the embodiment shown in FIG. 7, the reference voltage $V_{ref}(m)$, corresponding to the maximum number m of peak power operations, can be set to a voltage in a range between the electric potential $V_{ppm}(m)$ and the electric potential $V_{ppm}(m-1)$:

$$\frac{(m-1)R_d}{(m-1)R_d + R_u} V_{dd} < V_{ref}(m) < \frac{mR_d}{mR_d + R_u} V_{dd} \qquad (7)$$

In the example shown in FIG. 13, if the maximum number of peak power operations allowed is 2, the reference voltage $V_{ref}$ can be a voltage in a range between $V_{ppm}(2)$=0.6V and $V_{ppm}(1)$=0.4 V, where $V_{ref}(2)$=0.5 V can be chosen in FIG. 13 as an example. If the electric potential $V_{ppm}$ is less than the reference voltage $V_{ref}$=0.5 V, the PPM enablement signal enPPM=0 is generated at the output terminal 330 (see FIG. 11), indicating that the number of peak power operations is 0 or 1, less than the maximum number of 2. The storage system can have at least one additional peak power operation performed by at least one of the memory dies. When there are two peak power operations performed simultaneously, e.g., two memory dies are consuming the peak current $I_{cc}$, the electric potential $V_{ppm}$=0.6 V, higher than the reference voltage $V_{ref}$=0.5 V. The PPM enablement signal enPPM=1 can be generated accordingly, indicating that the maximum number of peak power operations of 2 has been reached. The NAND storage system can then prohibit additional memory die to perform a peak power operation. As such, the PPM enablement signal enPPM can function as an indicator for the number of peak power operations performed in the storage system with multiple memory dies. Through analog PPM circuit 1100 and voltages (e.g., analog voltages) associated with the electric potential $V_{ppm}$, the reference voltage $V_{ref}$, the first and second control signals 340/342, etc., multiple peak power operations can be controlled simultaneously.

With respect to algorithm for managing peak power operations using the PPM circuits 1100, the peak power check routine can be very similar to that described in FIG. 10.

Figure 14:
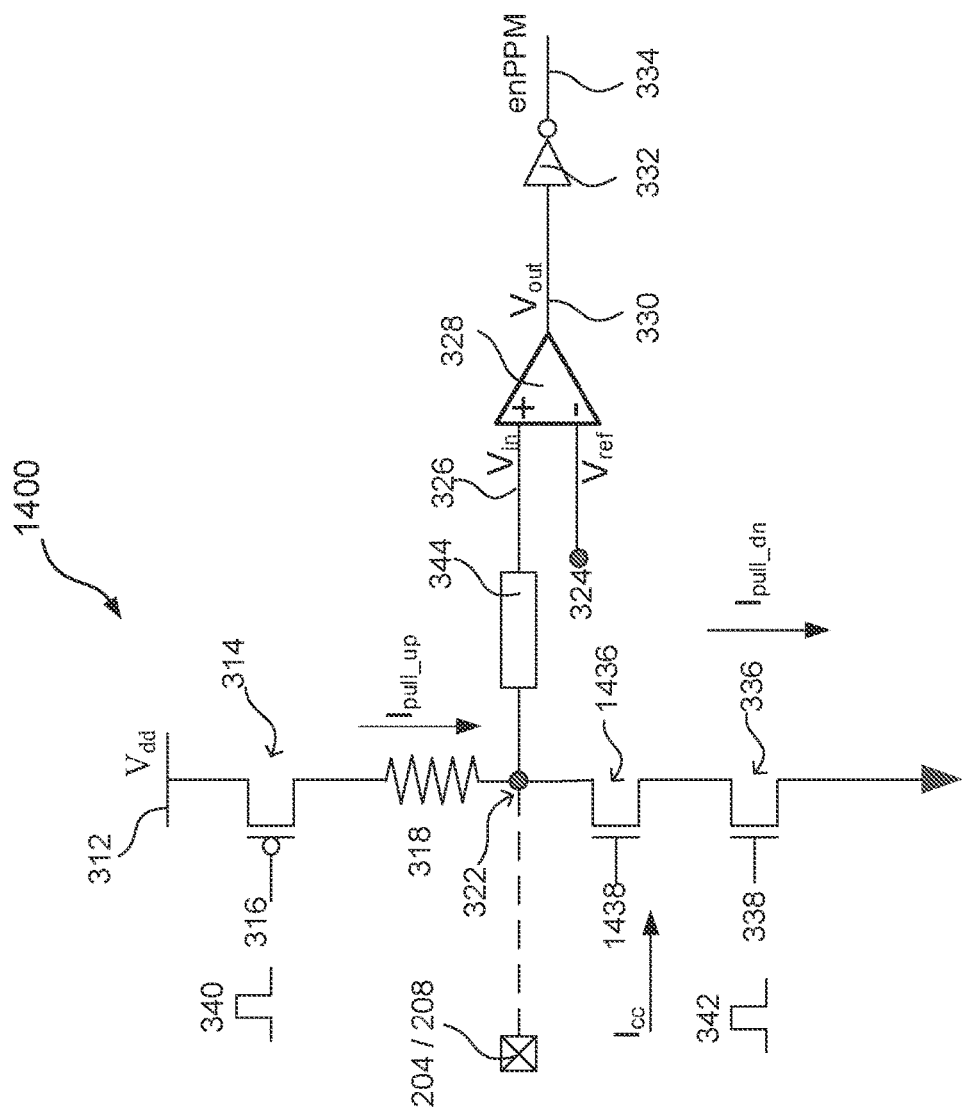
FIG. 14 illustrates a peak power management circuit, according to some embodiments of the present disclosure.

FIG. 14 illustrates an exemplary PPM circuit 1400 on the NAND flash memory 100, according to some embodiments of the present disclosure, where each of the PPM1 circuits 202 and each of the PPM2 circuits 206 shown in FIG. 2 can be similar to the PPM circuit 300. The PPM circuit 1400 is similar to the PPM circuit 300 except that the pull-down resistor 320 in FIG. 3 can be replaced by a pull-down current source 1436.

The pull-down current source 1436 can be any current source that provide constant current. In some embodiments, the pull-down current source 1436 can be a transistor, for example, a field-effect transistor (FET). In FIG. 14, a n-channel MOSFET is shown as an example. However, the pull-down current source 1436 is not so limiting. For example, the pull-down current source 1436 can be a bipolar transistor. In FIG. 14, the pull-down driver 336 is also a n-channel MOSFET. However, the pull-down driver 336 is not so limiting. The pull-down driver 336 can also be any suitable transistor. The functionality of the other components of the PPM circuit 1400 is similar to the PPM circuit 300 described with respect to FIG. 3, and only the differences will be discussed below.

In FIG. 14, the magnitude of the pull-down current $I_{pull\_dn}$ flowing through the pull-down current source 1436 can be controlled through a gate terminal 1438. The pull-down current $I_{pull\_dn}$ can be determined by the voltage level at the gate terminal 1438 and the trans-conductance of the pull-down current source 1436. In this example, the pull-down driver 336 can be switched on or off to signal whether there is a peak power operation performed on the memory die. For example, the pull-down driver 336 can be switched on when a voltage applied to the gate terminal 338 of the pull-down driver 336 corresponds to the peak current $I_{cc}$. As such, the peak power operations can be regulated for each memory die through the pull-down current $I_{pull\_dn}$. Similar to the PPM circuit 300 in FIG. 3, through the die-to-die connections at the PPM contact pads, peak power operations throughout the entire storage system can be coordinated between different memory dies using the PPM circuit 1400.

Similar to the operations of the PPM circuits 300 in FIGS. 3-6, implementation of the PPM circuits 1400 can include by switching on only one pull-up driver 314 within each PPM group (e.g., within the PPM1 group 210 or the PPM2 group 211 in FIG. 2) for peak power management and by switching off the other pull-up drivers 314 in the same PPM group. As such, current only flows from the power source 312 through one pull-up resistor 318 in each PPM group. During operation, the pull-down driver 336 can be switched on or off depending on the status of the memory die, and can be independently controlled according to the PPM management scheme discussed below. Accordingly, in each PPM group, the electric potential $V_{ppm}$ of the node 322 (or the PPM pins) depends on the number of pull-down drivers 336 that are switched on in the respective PPM group. By monitoring the electric potential $V_{ppm}$, the number of peak power operations performed in a storage system having multiple memory dies can thereby be regulated.

Figure 15:
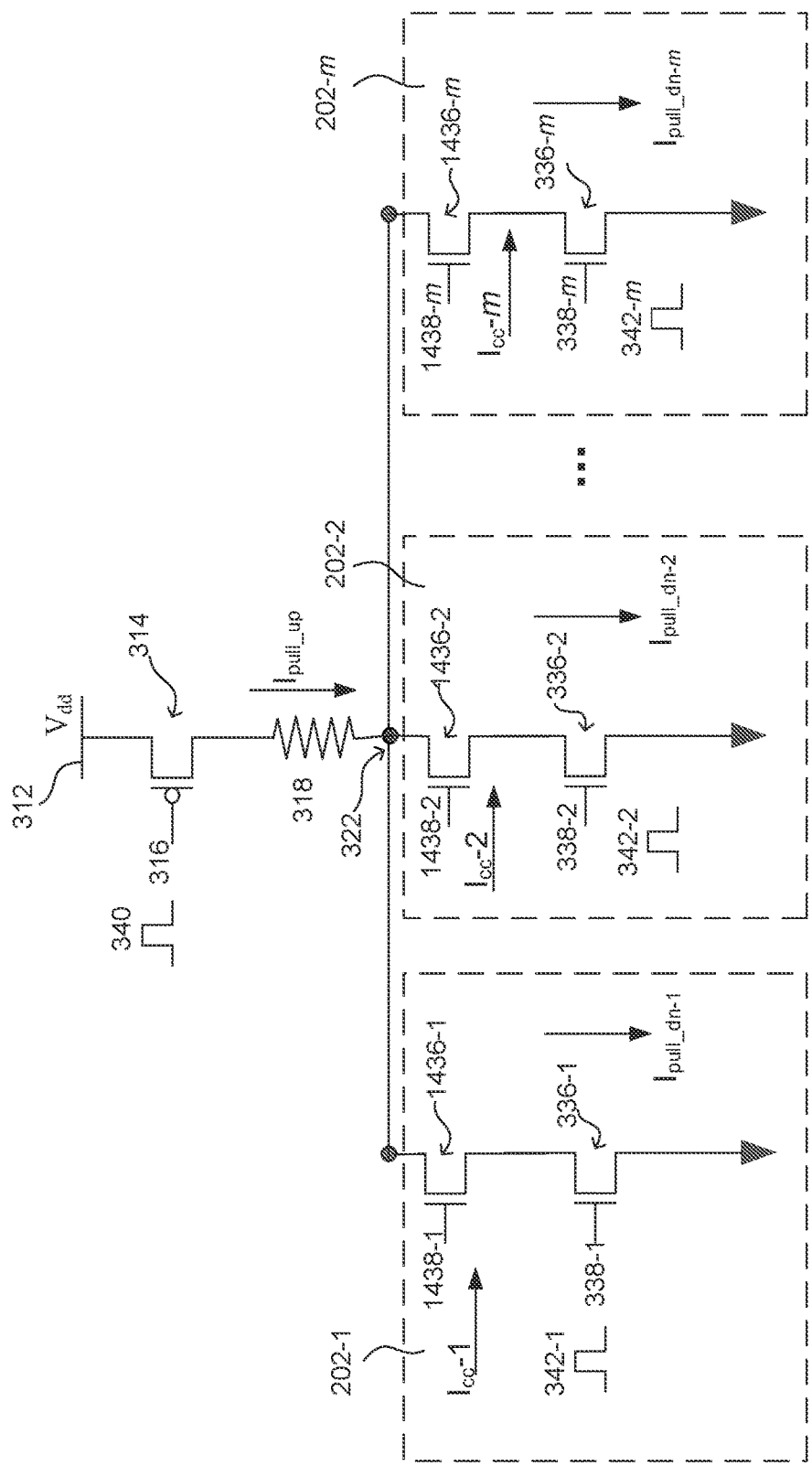
FIG. 15 illustrates an equivalent circuit of a peak power management group, according to some embodiments of the present disclosure.

FIG. 15 shows an equivalent circuit 1500 of a PPM group, according to some embodiments of the present disclosure. The PPM group can be the PPM1 group 210 or the PPM2 group 211 in the storage system in FIG. 2. The pull-up drivers 314 and pull-down drivers 336 that are switched off can be omitted from the equivalent circuit 1500. As discussed previously, the node 322 can be held at the same electrical potential $V_{ppm}$ in the entire PPM group between different memory dies.

In some embodiments, only one pull-up driver 314 is switched on in one PPM group for peak power management. In some embodiments, the pull-down driver 336 is switched on in the PPM circuit corresponding to the memory die performing the peak power operation, i.e., using the peak current $I_{cc}$. The pull-down drivers 336 in the same PPM group are connected in parallel with each other. In this configuration, the pull-up current $I_{pull\_up}$ flowing through the pull-up driver 314 that is switched on, is the sum of the pull-down current $I_{pull-dn}$ (e.g., $I_{pull\_dn-1}$, $I_{pull\_dn-2}$, . . . , $I_{pull\_dn-m}$) flowing through each of the pull-down drivers 336 that are switched on. The electric potential $V_{ppm}$ of the node 322 can be expressed as a function of m, the number of peak power operations, i.e., the number of memory dies performing peak power operations if one memory die performs one peak power operation:

$$V_{ppm}(m)=V_{dd}-m*i*R_u \qquad (8)$$

where $V_{dd}$ is the voltage of the power source, $R_u$ is the resistances of the pull-up resistor 318, and i is the magnitude of the pull-down current $I_{pull-dn}$ controlled by the pull-down current sources 1436 (e.g., 1436-1, 1436-2, . . . , 1436-m). In some embodiments, the magnitude of the pull-down current $I_{pull-dn}$ (e.g., $I_{pull\_dn-1}$, $I_{pull\_dn-2}$, . . . , $I_{pull\_dn-m}$) can be different on different memory dies and a person of skill in the art can modify the Equation (8) accordingly. As shown in Equation (8), by using the pull-down current source 1436 in FIG. 14 instead of the pull-up resistor 318 in FIG. 3, the electrical potential $V_{ppm}$ at the node 322 (or at the first and second PPM contact pads 204/208) can have a liner relationship with the number m of the peak power operations. In this example, the electrical potential $V_{ppm}$ decreases when the number m of the peak power operations increases. As the number of peak power operations (i.e., the variable m) changes continuously, the electric potential $V_{ppm}$ changes continuously accordingly. As such, through an analog circuit like the PPM circuit 1400, information about the peak power operations in each PPM group can be encoded into the electric potential $V_{ppm}$ of the PPM pins in an analog way.

FIG. 16 illustrates an exemplary peak power management scheme, according to some embodiments of the present disclosure. In this example, the voltage $V_{dd}$ of the power source 312 is assumed to be 1.2 V. The resistance $R_u$ of the pull-up resistor 318 is assumed to be 1000 ohm. The magnitude i of the pull-down current $I_{pull\_dn}$ is 160 μA. It is noted that the assumptions of the voltage $V_{dd}$, the resistance $R_u$, and the magnitude i of the pull-down current $I_{pull\_dn}$ are chosen to provide an illustration of the principles of the peak power management scheme in the present disclosure. A person of ordinary skill in the art can utilize the principle of the peak power management scheme described here with various modifications as suitable for the practical applications. All such modifications and variations are within the scope of the present disclosure.

At the beginning of peak power management, any one of the pull-up driver 314 in the PPM group can be switched on. If there is no memory die performing peak power operation, none of the pull-down drivers 336 is switched on. The electric potential $V_{ppm}$ of the node 322 is set to the voltage $V_{dd}$ of the power source 312 through the conductive path established by the specific pull-up driver 314 that is switched on. If $V_{dd}$=1.2V, then $V_{ppm}(0)$=1.2 V (at m=0).

When one of the memory dies, e.g., the NAND flash memory 100-1 in FIG. 2, is performing the peak power operation, the memory die consumes the peak current $I_{cc-1}$. As discussed previously, the second control signal 342-1 can be generated to switch on the pull-down driver 336-1 to enable the peak power operation on the NAND flash memory 100-1. As such, the pull-down current hull can flow through the pull-down driver 336-1 and the pull-down current source 1436-1. The electric potential $V_{ppm}$ at the node 322 is changed to $V_{ppm}(1)=V_{dd}*R_u$=1.04 V (at m=1).

When another memory die, e.g., the NAND flash memory 100-2 (in FIG. 2), is also performing the peak power operation, there are two memory dies (m=2) in the storage system 10 are now using the peak current $I_{cc}$, i.e., the peak current $I_{cc-1}$ on the NAND flash memory 100-1 and the peak current $I_{cc-2}$ on the NAND flash memory 100-2. As discussed previously, the second control signal 342-2 can be generated to switch on the pull-down driver 336-2 to enable the peak power operation on the NAND flash memory 100-2. As such, the pull-down current $I_{pull\_dn-2}$ can flow through the pull-down driver 336-2 and the pull-down current source 1436-2. The pull-down current $I_{pull\_dn-1}$ and the pull-down current $I_{pull\_dn-2}$ flow through the pull-down current source 1436-1 and the pull-down current source 1436-2, respectively, where the pull-down current source 1436-1 and the pull-down current source 1436-2 are connected in parallel. The electric potential $V_{ppm}$ at the node 322 is then changed to $V_{ppm}(2)=V_{dd}-2*i*R_u$=0.88 V (at m=2).

When a third memory die, e.g., the NAND flash memory 100-3, is also performing the peak power operation, i.e., three memory dies (m=3) in the storage system 10 are consuming the peak current $I_{cc}$, the electric potential $V_{ppm}$ at the node 322 is then changed to $V_{ppm}(3)=V_{dd}-3*i*R_u$=0.72 V (at m=3).

Using the Equation (8), the electric potential $V_{ppm}$ can be calculated if four memory dies (m=4) in the storage system 10 are using the peak current $I_{cc}$, i.e. performing the peak power operations. The electric potential $V_{ppm}(4)=V_{dd}-4*i*R_u=0.56$ V. The electric potentials $V_{ppm}(m)$ are listed in FIG. 16 for various number of peak power operations (i.e., 0, 1, 2, 3, 4, ..., m−1, m).

As discussed above, the electric potential $V_{ppm}$ of a PPM group depends on the number of peak power operations. According to Equation (8) and FIG. 16, the electric potential $V_{ppm}$ decreases when the number of the peak power operations increases. Therefore, the reference voltage $V_{ref}$ for the comparator 328 (in FIG. 14) can be chosen such that the PPM enablement signal enPPM can be set at enPPM=0 when the electric potential $V_{ppm}$ is higher than the reference voltage $V_{ref}$, i.e., when the number of memory dies performing peak power operations is less than a predetermined number. And the PPM enablement signal enPPM can be set at enPPM=1 when the electric potential $V_{ppm}$ is not higher than the reference voltage $V_{ref}$, i.e., when the number of memory dies performing peak power operations has reached (equal or greater than) the predetermined number. In the other words, the reference voltage $V_{ref}$ can be programmed to correspond to the maximum number of peak power operations allowed in a storage system. Accordingly, when the PPM enablement signal enPPM=0, the storage system can still provide additional peak current $I_{cc}$ to at least one of the memory dies, i.e., having enough power (or current) to provide at least one additional memory die to perform peak power operation. On the contrary, when the PPM enablement signal enPPM=1, the maximum number of peak power operations have been reached for the storage system. The storage system has reached its power (or current) limit and cannot provide additional peak current $I_{cc}$ to any of the memory dies to perform any additional peak power operation.

For a storage system where each memory die includes more than one PPM group, one reference voltage $V_{ref}$ can be chosen for each PPM group to output a PPM enablement signal enPPM for controlling a maximum number of peak power operations. In the example of the storage system in FIG. 2, the PPM1 group can have a reference voltage $V_{ref-1}$ programed to correspond to a number $m_1$—the maximum number of peak power operations allowed in the PPM1 group. Similarly, the PPM2 group can have a reference voltage $V_{ref-2}$ programed to correspond to a number $m_2$—the maximum number of peak power operations allowed in the PPM2 group.

For illustration purpose below, it is assumed that the maximum number of peak power operations in a storage system (or in each memory group) is the number m, and each memory die can perform a peak power operation at a time. It is noted that these assumptions are chosen for simplicity and should not limit the scope of this disclosure. For example, each memory die can perform two or more peak power operations simultaneously.

According to Equation (8), if there are m−1 number of peak power operations, the electric potential $V_{ppm}$ can be expressed as:

$$V_{ppm}(m-1)=V_{dd}-(m-1)*i*R_u \quad (9)$$

Thus, the reference voltage $V_{ref}(m)$, corresponding to the maximum number m of peak power operations, can be set to a voltage in a range between the electric potential $V_{ppm}(m)$ and the electric potential $V_{ppm}(m-1)$:

$$V_{dd}-m*i*R_u<V_{ref}(m)<V_{dd}-(m-1)*i*R_u \quad (10)$$

In the example shown in FIG. 16, if the maximum number of peak power operations allowed is 2, the reference voltage $V_{ref}$ can be a voltage in a range between $V_{ppm}(2)=0.88$ V and $V_{ppm}(1)=1.12$ V, where $V_{ref}(2)=0.96$ V is chosen in FIG. 16 as an example. If the electric potential $V_{ppm}$ is higher than the reference voltage $V_{ref}=0.96$ V, the PPM enablement signal enPPM=0 is generated at the output terminal 334 (see FIG. 14), indicating that the number of peak power operations is 0 or 1, less than the maximum number of 2. The storage system can have at least one additional peak power operation performed by at least one of the memory dies. When there are two peak power operations performed simultaneously, i.e., two memory dies are consuming the peak current $I_{cc}$, the electric potential $V_{ppm}=0.88$ V, lower than the reference voltage $V_{ref}=0.96$ V. The PPM enablement signal enPPM=1 is generated accordingly, indicating that the maximum number of peak power operations of 2 has been reached. The NAND storage system can then prohibit additional memory die to perform a peak power operation. As such, the PPM enablement signal enPPM can function as an indicator for the number of peak power operations performed in the storage system with multiple memory dies.

As discussed above, the PPM enablement signal enPPM for each PPM group can be generated by comparing the reference voltage $V_{ref}$ with the electric potential $V_{ppm}$ of the PPM pins (or at the node 322) that are electrically connected between the memory dies. The PPM enablement signal enPPM is set to 0 if the electric potential $V_{ppm}$ of the PPM pins is higher than the reference voltage $V_{ref}$. The PPM enablement signal enPPM is set to 1 if the electric potential $V_{ppm}$ of the PPM pins is not higher than the reference voltage $V_{ref}$. Because the electric potential $V_{ppm}$ depends on the pull-down current $I_{pull\_dn}$ flowing through each of the pull-down drivers in the PPM group, and the pull-down driver is switched on when peak power operation is performed on the corresponding memory die, thus the reference voltage can be selected based on a maximum m number of peak power operations for the storage system. Through analog PPM circuit 1400 and voltages (e.g., analog voltages) associated with the electric potential $V_{ppm}$, the reference voltage $V_{ref}$, gate voltage applied to the pull-down current sources 1436, etc., multiple peak power operations can be controlled simultaneously.

With respect to algorithm for managing peak power operations using the PPM circuits 1400, the peak power check routine can be very similar to that described in FIG. 6 with similar equivalent circuit.

In summary, all of the above analog peak power management methods can be applied to an asynchronous multiplane independent (AMPI) read operation. In a NAND storage system, each storage system includes multiple memory dies and each memory die can have multiple memory planes. For example, the NAND flash memory 100 shown in FIG. 1B includes four memory planes 101. Read operations from different memory planes need to be staggered to avoid coincidence of peak current, and thereby are referred to as AMPI read. In some embodiments, an AMPI read can be defined as a peak power operation. Each memory plane's AMPI can be controlled by a PPM circuit, or more specifically can be controlled through the pull-down driver. The PPM circuits from a group of memory planes can be electrically connected through the PPM pins to form a PPM group, where the maximum number of peak power operations can be predetermined according to the peak power (or peak current) budget of the NAND storage system.

The present disclosure also provides a method of peak power management (PPM) for a storage system with multiple memory dies, wherein each of the multiple memory dies includes a first PPM circuit and a second PPM circuit.

First PPM circuits of the multiple memory dies are electrically connected to form a first PPM group, and second PPM circuits of the multiple memory dies are electrically connected to form a second PPM group. The method includes the following steps: switching on a first pull-down driver of the first PPM circuit on a selected memory die when a first PPM enablement signal of the first PPM group is zero; waiting for a first delay period; switching on a second pull-down driver of the second PPM circuit on the selected memory die when a second PPM enablement signal of the second PPM group is zero; and performing a peak power operation on the selected memory die. The first and second PPM enablement signals depend on the current flowing through each of the pull-down drivers in the first and second PPM groups.

The present disclosure provides a peak power management (PPM) circuit for a storage system with multiple memory dies. The PPM circuit includes a pull-up driver electrically connected between a power source and a PPM pin; and a pull-down driver electrically connected between a ground and the PPM pin, wherein the pull-up driver and the pull-down driver are connected in series; and the PPM circuit is configured to manage a peak power operation for the memory die based on an electric potential of the PPM pin, wherein PPM pins of PPM circuits on different memory dies are electrically connected.

The present disclosure discloses a method of peak power management (PPM) for a storage system with multiple memory dies, wherein each of the multiple memory dies comprises a PPM circuit, and each PPM circuit comprises a pull-up driver connected in series with a pull-down driver. The method includes sending a first control signal to switch on a corresponding pull-up driver on one of the multiple memory dies; sending a second control signal to switch on a respective pull-down driver on a selected memory die based on a PPM enablement signal; and performing a peak power operation on the selected memory die.

The present disclosure further discloses a method of peak power management (PPM) for a storage system with multiple memory dies, wherein each of the multiple memory dies comprises a PPM circuit, and each PPM circuit comprises a pull-up driver connected in series with a pull-down driver. The method includes sending a second control signal to switch on a corresponding pull-down driver on one of the multiple memory dies; sending a first control signal to switch on a respective pull-up driver on a selected memory die based on a PPM enablement signal; and performing a peak power operation on the selected memory die.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A peak power management (PPM) circuit for a storage system with multiple memory dies, the PPM circuit being provided in a memory die of the multiple memory dies and comprising:
 a PPM pad, wherein PPM pads of PPM circuits including at least the PPM circuit in the multiple memory dies are electrically connected;
 a pull-up driver electrically connected between a power source and the PPM pad;
 a pull-down driver electrically connected between a ground and the PPM pad, wherein:
  the pull-up driver and the pull-down driver are connected in series; and
  one of the pull-up driver and the pull-down driver is controlled by a control signal corresponding to a peak power operation performed on the memory die so that an electric potential of the PPM pad is determined by the peak power operation in an analog way; and
 a filter coupled to the PPM pad.

2. The PPM circuit of claim 1, further comprising:
 a pull-up resistor electrically connected between the power source and the PPM pad, wherein the pull-up resistor is connected in series with the pull-up driver.

3. The PPM circuit of claim 1, further comprising:
 a pull-down resistor electrically connected between the ground and the PPM pad, wherein the pull-down resistor is connected in series with the pull-down driver.

4. The PPM circuit of claim 1, further comprising:
 a pull-up current source electrically connected between the power source and the PPM pad, wherein:
  the pull-up current source is connected in series with the pull-up driver and is configured to provide constant current; and
  the pull-up driver is controlled by the control signal corresponding to the peak power operation.

5. The PPM circuit of claim 1, further comprising:
 a pull-down current source electrically connected between the ground and the PPM pad, wherein:
  the pull-down current source is connected in series with the pull-down driver and is configured to provide constant current; and
  the pull-down driver is controlled by the control signal corresponding to the peak power operation.

6. The PPM circuit of claim 1, further comprising:
 an output circuit for outputting a PPM enablement signal, wherein the PPM pad is electrically connected through the filter with a first input terminal of the output circuit, and the output circuit is configured to output the PPM enablement signal according to the electric potential of the PPM pad.

7. The PPM circuit of claim 6, wherein the output circuit comprises:

a comparator with a first input terminal electrically connected to the PPM pad through the filter and a second input terminal electrically connected to a reference voltage.

8. The PPM circuit of claim 7, wherein the reference voltage is based on a maximum number of peak power operations allowed for the multiple memory dies.

9. The PPM circuit of claim 8, wherein the PPM enablement signal is set as a first logic state when the electric potential of the PPM pad is not higher than the reference voltage, and is set as a second logic state when the electric potential of the PPM pad is higher than the reference voltage.

10. The PPM circuit of claim 7, wherein the output circuit further comprises:
an inverter with an input connected to an output terminal of the comparator, wherein the inverter is configured to output the PPM enablement signal for determining whether to perform the peak power operation.

11. The PPM circuit of claim 1, wherein the electric potential of the PPM pad depends on a number of peak power operations performed by the multiple memory dies in the storage system.

12. A peak power management (PPM) system for a storage system with multiple memory dies, comprising one or more PPM groups, each of the one or more PPM groups comprising multiple PPM circuits, each of the multiple PPM circuits being provided in a memory die and comprising:
a PPM pad, wherein in each of the one or more PPM groups, PPM pads of PPM circuits in different memory dies are electrically connected;
a pull-up driver electrically connected between a power source and the PPM pad;
a pull-down driver electrically connected between a ground and the PPM pad; and
a filter coupled to the PPM pad,
wherein the PPM system is configured to manage a peak power operation for the multiple memory dies based on an electric potential of the PPM pad.

13. The PPM system of claim 12, wherein in each of the multiple PPM circuits, the pull-up driver and the pull-down driver are connected in series, and one of the pull-up driver and the pull-down driver is controlled by a control signal corresponding to the peak power operation performed on the memory die so that the electric potential of the PPM pad is determined by the peak power operation in an analog way.

14. The PPM system of claim 13, wherein the electric potential of the PPM pad in each of the one or more PPM groups depends on a number of peak power operations performed by the multiple memory dies in the storage system.

15. The PPM system of claim 13, wherein each of the multiple PPM circuits further comprises:
a pull-up current source electrically connected between the power source and the PPM pad, wherein:
the pull-up current source is connected in series with the pull-up driver and is configured to provide constant current; and
the pull-up driver is controlled by the control signal corresponding to the peak power operation.

16. The PPM system of claim 15, wherein the electric potential of the PPM pad in each of the one or more PPM groups increases linearly with a number of peak power operations performed by the multiple memory dies of the storage system.

17. The PPM system of claim 13, wherein each of the multiple PPM circuits further comprises:

a pull-down current source electrically connected between the ground and the PPM pad, wherein:
the pull-down current source is connected in series with the pull-down driver and is configured to provide constant current; and
the pull-down driver is controlled by the control signal corresponding to the peak power operation.

18. The PPM system of claim 17, wherein the electric potential of the PPM pad in each of the one or more PPM groups decreases linearly with a number of peak power operations performed by the multiple memory dies of the storage system.

19. The PPM system of claim 12, wherein each of the multiple PPM circuits further comprises:
a pull-up resistor electrically connected between the power source and the PPM pad, wherein the pull-up resistor is connected in series with the pull-up driver.

20. The PPM system of claim 12, wherein each of the multiple PPM circuits further comprises:
a pull-down resistor electrically connected between the ground and the PPM pad, wherein the pull-down resistor is connected in series with the pull-down driver.

21. The PPM system of claim 12, wherein each of the one or more PPM groups further comprises:
an output circuit for outputting a PPM enablement signal, wherein the PPM pads of the PPM circuits of a respective PPM group are electrically connected with a first input terminal of the output circuit through the filter, and the output circuit is configured to output the PPM enablement signal according to the electric potential of the PPM pads.

22. The PPM system of claim 21, wherein the output circuit comprises:
a comparator with a first input terminal electrically connected to the PPM pads of the PPM circuits of the respective PPM group through the filter and a second input terminal electrically connected to a reference voltage.

23. The PPM system of claim 22, wherein the reference voltage is based on a maximum number of peak power operations allowed for the multiple memory dies.

24. The PPM system of claim 23, wherein the PPM enablement signal is set as a first logic state when the electric potential of the PPM pad is not higher than the reference voltage, and is set as a second logic state when the electric potential of the PPM pad is higher than the reference voltage.

25. The PPM system of claim 22, wherein the output circuit further comprises: an inverter with an input connected to an output terminal of the comparator, wherein the inverter is configured to output the PPM enablement signal for determining whether to perform the peak power operation.

26. The PPM system of claim 12, wherein pull-up drivers in different memory dies are connected in parallel with each other in each of the one or more PPM groups when each of the pull-up drivers is controlled by a respective control signal corresponding to a respective peak power operation performed by a respective memory die; and wherein only one pull-down driver in each of the one or more PPM groups is switched on.

27. The PPM system of claim 12, wherein pull-down drivers in different memory dies are connected in parallel with each other in each of the one or more PPM groups when each of the pull-down drivers is controlled by a respective control signal corresponding to a respective peak power operation performed by a respective memory die; and wherein only one pull-up driver in each of the one or more PPM groups is switched on.

28. A method of peak power management (PPM) for a storage system with multiple memory dies, wherein each of the multiple memory dies comprises a PPM circuit, and each PPM circuit comprises a pull-up driver connected in series with a pull-down driver, the method comprising:
receiving a first control signal to switch on a first pull-up driver or a first pull-down driver on one of the multiple memory dies;
receiving a second control signal to switch on a second pull-down driver or a second pull-up driver on a certain memory die based on a PPM enablement signal;
generating the PPM enablement signal by comparing a reference voltage with an electric potential of a PPM pad of the PPM circuit, wherein PPM pads of PPM circuits on different memory dies are electrically connected and the electric potential depends on a number of peak power operations performed by the multiple memory dies in the storage system; and
performing a peak power operation on the certain memory die.

29. The method of claim 28, wherein the receiving of the second control signal comprises applying an analog voltage on a gate terminal of the second pull-down driver or the second pull-up driver.

30. The method of claim 29, further comprising:
switching on the second pull-down driver or the second pull-up driver based on a peak power current used during the peak power operation.

31. The method of claim 28, further comprising:
selecting the reference voltage based on a maximum number of peak power operations for the storage system.

32. The method of claim 28, further comprising:
generating, by a pull-down current source or a pull-up current source, a pull-down current or a pull-up current, respectively, which is proportional to a peak power current for the peak power operation.

33. A memory die, comprising:
a communication interface;
a PPM circuit coupled to the communication interface, the PPM circuit comprising:
a PPM pad, wherein the PPM pad is electrically connected to the PPM pad of the PPM circuit of at least one other memory die of multiple memory dies including the memory die;
a pull-up driver electrically connected between a power source and the PPM pad;
a pull-down driver electrically connected between a ground and the PPM pad; and
a filter coupled to the PPM pad,
wherein the communication interface is configured to receive a PPM circuit selecting signal for enabling the pull-down driver or the pull-up driver of the memory die to be switched on.

34. The memory die of claim 33, wherein the PPM circuit further comprises:
a pull-up resistor electrically connected between the power source and the PPM pad, wherein the pull-up resistor is connected in series with the pull-up driver.

35. The memory die of claim 34, wherein the PPM circuit further comprises:
a pull-down resistor electrically connected between the ground and the PPM pad, wherein the pull-down resistor is connected in series with the pull-down driver, wherein one of the pull-up driver and the pull-down driver is controlled by a control signal corresponding to a peak power operation performed on the memory die.

36. The memory die of claim 33, wherein the PPM circuit further comprises:
a pull-up current source electrically connected between the power source and the PPM pad, wherein:
the pull-up current source is connected in series with the pull-up driver and is configured to provide constant current; and
the pull-up driver is controlled by a control signal corresponding to a peak power operation.

37. The memory die of claim 33, wherein the PPM circuit further comprises:
a pull-down current source electrically connected between the ground and the PPM pad, wherein:
the pull-down current source is connected in series with the pull-down driver and is configured to provide constant current; and
the pull-down driver is controlled by a control signal corresponding to a peak power operation.

38. The memory die of claim 33, wherein the PPM circuit further comprises:
an output circuit for outputting a PPM enablement signal, wherein the PPM pad is electrically connected through the filter with a first input terminal of the output circuit, and the output circuit is configured to output the PPM enablement signal according to an electric potential of the PPM pad.

39. The memory die of claim 38, wherein the output circuit comprises:
a comparator with a first input terminal electrically connected through the filter to the PPM pad and a second input terminal electrically connected to a reference voltage.

40. The memory die of claim 39, wherein the reference voltage is based on a maximum number of peak power operations allowed for multiple memory dies of a storage system.

41. The memory die of claim 39, wherein the output circuit further comprises:
an inverter with an input connected to an output terminal of the comparator, wherein the inverter is configured to output the PPM enablement signal for determining whether to perform a peak power operation.

* * * * *